US007368217B2

(12) United States Patent
Lutz et al.

(10) Patent No.: US 7,368,217 B2
(45) **Date of Patent: *May 6, 2008**

(54) MULTILAYER IMAGE, PARTICULARLY A MULTICOLOR IMAGE

(75) Inventors: Norbert Lutz, Rückersdorf (DE); Gerhard Zinner, Pyrbaum (DE); Matthias Schumacher, Borchen (DE); Ulrich Knaack, Paderborn (DE); Dirk Fischer, Paderborn (DE)

(73) Assignee: ORGA Systems GmbH, Paderborn (DE)

( * ) Notice: Subject to any disclaimer, the term of this patent is extended or adjusted under 35 U.S.C. 154(b) by 406 days.

This patent is subject to a terminal disclaimer.

(21) Appl. No.: 10/513,615

(22) PCT Filed: May 8, 2002

(86) PCT No.: PCT/DE02/01678

§ 371 (c)(1),
(2), (4) Date: Jan. 13, 2005

(87) PCT Pub. No.: WO03/095226

PCT Pub. Date: Nov. 20, 2003

(65) Prior Publication Data

US 2005/0118537 A1 Jun. 2, 2005

(51) Int. Cl.
*G03F 7/00* (2006.01)
*G03F 7/095* (2006.01)

(52) U.S. Cl. .................. 430/200; 430/270.1; 430/944; 430/945; 430/962; 428/323

(58) Field of Classification Search ................ 430/200, 430/270.1, 944, 945, 962
See application file for complete search history.

(56) References Cited

U.S. PATENT DOCUMENTS 5,075,195 A 12/1991 Babler et al.
5,240,900 A * 8/1993 Burberry .................... 503/227
5,289,547 A * 2/1994 Ligas et al. ................... 283/72
6,827,283 B2 * 12/2004 Kappe et al. ............... 235/494

FOREIGN PATENT DOCUMENTS

| | | |
|---|---|---|
| DE | 100 47 450 A1 | 4/2002 |
| EP | 1 022 625 A1 | 7/2000 |
| JP | 62-203692 | 12/1987 |
| JP | 2004584 | 1/1990 |
| JP | 3106944 | 5/1991 |
| JP | 03-270980 | 12/1991 |

(Continued)

*Primary Examiner*—Amanda Walke
(74) *Attorney, Agent, or Firm*—Hoffmann & Baron, LLP

(57) ABSTRACT

The invention relates to a process for the production of a multi-layer image, preferably a multi-color image. A transfer film which is applied to a paper ubstrate and which is treated with laser irradiation is used. The transfer film has a laser-sensitive layer and a background layer arranged therebeneath. The laser-sensitive layer comprises laser-sensitive material, for example laser-sensitive pigments or other laser-sensitive coloring agents. The laser-sensitive material in the layer is region-wise bleached by laser irradiation. That results in a so-called laser-induced image component. As it is transparent or partly transparent, the background layer which is arranged therebeneath and which can have a printed image then becomes visible from above in that region. That therefore gives a multi-layer image which is formed by the laser-induced image component and by the background layer jointly.

28 Claims, 36 Drawing Sheets

FOREIGN PATENT DOCUMENTS

| | | |
|---|---|---|
| JP | 4344285 | 11/1992 |
| JP | 09-123607 | 5/1997 |
| JP | 9277705 | 10/1997 |
| JP | 11-504879 | 5/1999 |
| WO | WO 96/35585 | 11/1996 |

* cited by examiner 4
4a
5
5d
10

4
4a
5
5b 4a
5b

10

10
4a
5b 4
4a
5
5b 5b
4a
Laserbestrahlung
10

10
4a 4
4a
5
5d 4a
5d

10

10
4a
5d 4
4a
5
5b
10
10x
10y
10z 4
4a
5
5b 10
5b

10xs
10
10x
10y
Peter Müller
Peter Müller Peter Müller 10y
10x
5b 4
4a
5
5b 4a
5b 10x
10y 10y
10x
5b 5
5b
4
4a 5b
4a 10Y
5
4
10x 5b
10x
10y 4
4a
5
5
5b 4a
5
5b 10x
10y
10x
10y 10x
10y
5
5b 5
5b
4
4a
5r 5b
5r
4a 5
5b
5r
10x
4
10y 5b
5r
10x
10y 5
5b
5r
4
4a
10x
10y

MULTILAYER IMAGE, PARTICULARLY A MULTICOLOR IMAGE

CROSS-REFERENCE TO RELATED APPLICATIONS

This application is a National Phase application of International Application No. PCT/DE02/01678 filed May 8, 2002, which is incorporated herein by reference.

BACKGROUND OF THE INVENTION

The invention concerns a multi-layer image, in particular a multi-color image, of a substrate comprising paper material and a single-layer or multi-layer layer structure applied thereto using a transfer film, preferably a hot stamping film, or a laminating film.

SUMMARY OF THE INVENTION

The object of the present invention is to produce a multi-layer image, in particular a multi-color image, on a substrate preferably comprising paper material, using a transfer film, preferably a hot stamping film, or a laminating film. The invention seeks to provide that the multi-layer image has a high level of safeguard in respect of forgery. The invention also seeks to make it possible to provide configurations which are optically particularly attractive, in particular in regard to the number of different colors or various optical effects.

The invention attains that object with a multi-layer image as set forth in claim 1.

The multi-layer image produced in the layer structure is therefore composed of a laser-induced image component and the background layer, wherein the laser-induced image component has a plurality of colors and/or the laser-induced image component and the background layer differ from each other in color and/or in respect of the optical structure. The laser-induced image component is a region of the laser-sensitive layer, which is changed by laser action. That changed region of the laser-sensitive layer therefore forms the so-called laser-induced image component. The latter is arranged in such a way that it at least partially overlaps the background layer disposed therebeneath, so that the background layer is visible only in region-wise manner from above and/or is more or less translucently visible. The laser treatment of a region of the laser-sensitive layer, that is to say the formation of the laser-induced image component, means that a region of the background layer, which is not covered by the laser-induced image component, can be created and thus made visible. In that way the background layer can be optically exposed in a region-wise manner so that it is visible from above.

The laser-induced image component can therefore be in the form of a colorless transparent or color-shaded transparent or non-transparent marking. Images which are particularly interesting and attractive from the optical point of view and which are possibly complex can be obtained in the case of configurations in which it is provided that, in adjacent relationship beside the laser-induced image component, preferably adjoining same, arranged in the same laser-sensitive layer there is a further laser-induced image component or a region, which is not treated with laser, of the laser-sensitive layer, or a region which is not laser-sensitive. In this case that adjacent region can be colorlessly transparent or non-transparent or transparent with a color shading. The adjacent regions can involve different colors. Each image component can be in the form of a respective unitary homogeneous laser-induced marking, but it may also comprise a plurality of different laser-induced markings which are arranged side-by-side.

Particularly interesting and attractive optical effects are obtained in configurations in which it is provided that an image component formed in the background layer is provided in adjacent relationship beside the laser-induced image component, preferably adjoining same.

A high level of safeguard in relation to forgery is achieved with configurations in which the laser-induced image component is arranged in accurate register relationship with the associated image component which is formed in or by the background layer. It is preferably provided in such constructions that a plurality of laser-induced image components are arranged in accurate register relationship one beside the other and therefore the multi-layer image is composed of those many image components arranged in accurate register relationship with each other.

Particular optical effects are also achieved with configurations in which it is provided that the laser-induced image component is colorlessly transparent or is of a colored shaded transparent nature and an image component associated therewith in a layer disposed therebeneath is arranged laterally displaced or aligned with respect thereto in a direction perpendicular to the plane of the layer. That subjacent layer can involve the background layer which for example is in the form of a reflection layer with a diffraction structure preferably arranged in a limited region.

Many different configurations are possible in which the laser-induced image component is for example in the form of a colored marking and/or in the form of a graphic and/or in the form of text. A substantial advantage in the case of laser-induced image production is that the laser-induced image component can be produced with a very high degree of positional accuracy and a very high level of resolution for the laser beam can be guided with an extreme degree of positional accuracy and in so doing can produce markings of very small dimensions. A laser-induced image component can thus also form for example a microscript or a guilloche pattern or can form a part or the respective individual portions thereof.

In order to produce laser-induced image components, it can be provided that the laser-sensitive material is in the form of a material which can be changed by the action of the laser by way of laser-induced bleaching-out and/or laser-induced color change and/or laser-induced material removal. That change in the material is effected by the laser treatment preferably under laser conditions which are specific for the material and for the respectively desired effect. Preferably the different colors are produced by the action of the laser with a differing setting of the laser, preferably with different laser parameters such as laser wavelength and/or laser intensity. The laser-sensitive material may be coloring agent, preferably a mixture of various coloring agents. Pigments are to be considered as coloring agents. Pigments are preferably insoluble coloring agents, in particular they are inorganic substances. Alternatively or additionally it is also possible to use as the laser-sensitive material other coloring agents, for example soluble organic coloring agents.

In the case of configurations which in a particularly simple fashion make it possible to have a particularly large number of different color markings, it is provided that at least a region of the laser-sensitive layer has, in respect of its substance composition, a pigment mixture which is composed of at least three different pigment components, wherein each is bleachable by means of laser under laser conditions which are respectively specific for the pigment component and wherein it applies in respect of each of the three pigment components that, under the laser conditions which are specific to a pigment component, the other pigment components are not or are substantially not bleachable. A particularly effective and simple method of producing a full color image provides that production of the laser-induced image component is effected by a procedure whereby, in a first step by laser irradiation of a location of the laser-sensitive layer under laser conditions which are specific to one of the pigment components, only the one pigment component is bleached, and that in a second step by laser irradiation of the same location of the laser-sensitive layer under laser conditions which are specific for a further one of the pigment components, only said further pigment component is bleached. Laser-induced image components of any colors can preferably be obtained by the laser-sensitive layer comprising a pigment mixture, wherein one of the pigment components is a cyan pigment, another pigment component is a magenta pigment and a further pigment component is a yellow pigment. It has proven to be particularly advantageous if the cyan pigment is in the form of a pigment bleachable with red laser light, the magenta pigment is in the form of a pigment bleachable with green laser light and the yellow pigment is in the form of a pigment bleachable with blue laser light.

There are also provided configurations in which pigments or other so-called coloring agents or systems are used, which upon irradiation with suitable laser radiation, change their color, for example from transparency into a color or from a color 1 into a color 2.

A particularly simple process is afforded if the starting point thereof is a layer structure in which the background layer does not have any material which is laser-sensitive under the action of laser. It is however also possible for the process to be carried into effect with a layer structure in which the background layer also has laser-sensitive material. A particularly simple operating procedure is afforded if the layer structure has only one laser-sensitive layer and only one non-laser-sensitive layer. Non-laser-sensitive background layer means that no change in the background layer occurs under the laser conditions which are respectively applied during the process.

In preferred configurations it is provided that the background layer which is arranged under the laser-sensitive layer, preferably exclusively in the region under the laser-induced image component, is in the form of a background layer which reflects the laser radiation—used in production of the laser-induced image component—and/or is not transparent or substantially not transparent and/or absorbent for the laser radiation, in particular the non-reflected component of the laser radiation. That background layer can act on the one hand as a brightening agent for the laser-induced image component, in particular if the image component is a color marking, that is to say a colored image component. A substantially white background layer is obtained if its degree of reflection is of a virtually constant magnitude over the visible spectral range. In addition it is also possible for special pigments, in particular white pigments, to be incorporated into the background layer in order still further to increase the effect as a brightening agent or color booster. By virtue of the reflection and the non-transparency of the background layer for the non-reflected component of the laser radiation which acts in the laser treatment, this prevents a subjacent layer from suffering from damage or another unwanted laser-induced change in the laser irradiation procedure. In that sense therefore the background layer acts as a protective layer for the subjacent layer or layers. Alternatively or additionally to the non-transparency of the background layer, it can also be absorbent in respect of the above-mentioned, non-reflected component of the laser radiation. In particular embodiments it can be advantageous if that reflecting and/or non-transparent and/or absorbent background layer is arranged exclusively in a region under the laser-induced image component produced in the laser-sensitive layer disposed thereabove. In that way it is possible for the background layer to be freely designed outside that region in order to achieve particular optical effects, for example with a co-operation with the laser-induced image component. In that region of the background layer, which is thus outside, it is also possible to arrange laser-sensitive material in order there to produce a further laser-induced image component.

Particularly complex image configurations are possible if there are a plurality of laser-sensitive layers in the layer structure. They can advantageously be separated from each other by background layers which are arranged therebetween at least in a region-wise manner. Particularly interesting and attractive optical effects are afforded if the background layer, at least in a region-wise manner, has a reflection structure and/or is in the form of a reflection layer, preferably in the form of a metal layer, in particular a bright layer, for example a white lacquer layer. The background layer may also have in region-wise manner a diffraction structure, for example a diffraction grating, a hologram, a kinegram or the like, in particular in or with a metallic layer. Additionally or alternatively the background layer at least in a region-wise manner may also have printing thereon. Attractive additional effects are achieved if the background layer has different regions over its extent, for example different colors and/or a differing structure. In the case of embodiments which are particularly simple to produce, it is provided that the background layer is of a constant uniform nature over its extent.

The laser-induced image component which is produced by the action of laser on the laser-sensitive layer in a region in which the laser-sensitive layer is of a transparent nature in the visible spectral range can be in the form of a positive image in front of the background layer. Alternatively the laser-induced image component can also be formed by the laser-sensitive layer being made fully transparent or partly transparent by laser-induced bleaching by the action of laser on the laser-sensitive layer in a region in which the laser-sensitive layer is in the form of a covering layer, so that the background layer which was previously covered by the laser-sensitive covering layer becomes visible in that region.

The laser-induced image component can also be in the form of a watermark-like component insofar as the action of laser on the laser-sensitive layer, in a region in which the laser-sensitive layer is in the form of a partly transparent, preferably color-shaded layer, provides that the laser-induced image component is adapted to stand out in preferably partly transparent form in front of the background layer.

Embodiments with a particularly high level of safeguard in respect of forgery are obtained if the laser-induced image component is in the form of microscript. A high level of anti-forgery safeguard is basically also achieved by the laser operating with a high degree of register accuracy. The laser can be controlled by detection of configurational parameters in respect of the background layer, preferably detection of the printed or diffraction image and/or by detection of configurational parameters in respect of the laser-sensitive layer or the laser-induced image component, in particular by means of image processing. In that respect preferably the position, the direction of incidence of the laser beam, the laser wavelength, the period for which the laser acts, the number of pulses and/or the laser intensity can be controlled.

In preferred embodiments, in particular if the multi-layer image is produced in transfer films or hot stamping films or in laminating films, it is preferably provided that, in the laser treatment, exclusively the laser-sensitive layer is changed, more specifically preferably only by selective bleaching or selective color change. Advantageously, further layers which are possibly present such as protective layers, for example one or more upper protective layers, remain unchanged, in other words, those layers do not involve any damage in the laser irradiation procedure. In the case of embodiments which have a reflection layer, the reflection layer is preferably such that, with suitable guidance of the laser beam, it can pass therethrough and can act on the laser-sensitive layer which is possibly arranged therebeneath. A particularly high level of anti-forgery safeguard is achieved if the laser-sensitive layer or the laser-induced marking is arranged beneath the diffraction structure and/or the hologram structure and/or the reflection layer, as considered in a direction looking on to the multi-layer body or on to the substrate which is coated with the film, in which respect it is of particular advantage if the laser-induced marking is arranged immediately adjacent to that superposed structure or layer.

The term reflection layer or reflection area is used to denote a layer or a region which has elevated light reflection and/or an elevated refractive index. This involves a layer or a region which can be formed from metal or a metallic compound, for example aluminum, chromium, silver, zinc sulfide, titanium oxide and so forth, while a composition of other materials is also possible, for example germanium compounds, silicon compounds and so forth. This may involve a flat areal, preferably vapor-deposited layer or regions. That layer or those regions can be of a continuously interconnected nature or can be in the form of regions which are separated from each other. Embodiments are also possible in which the reflection property is achieved by suitable particles or the like, for example by metallic pigments.

BRIEF DESCRIPTION OF THE DRAWINGS

Preferred embodiments by way of example are described in greater detail hereinafter with reference to the accompanying Figures in which.

DETAILED DESCRIPTION OF THE INVENTION

Figure 1:
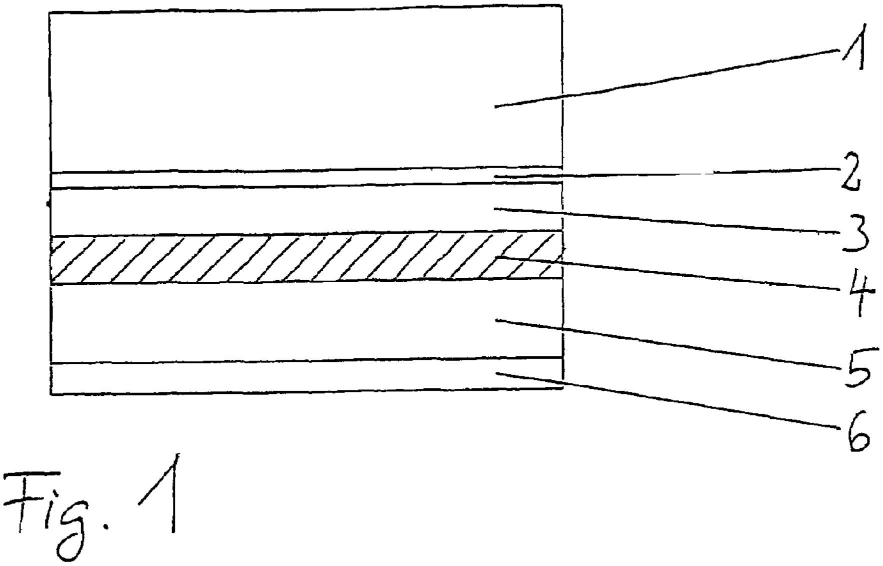
FIGS. 1 through 5 show sectional views of various hot stamping films each with a sensitive layer, in which a multi-layer image can be produced by laser treatment.

Hereinafter reference will firstly be made to FIGS. 1 through 10 to describe hot stamping films and laminating films, in the layer structure of which can be produced multi-layer and multi-color images according to the invention. Reference will also be made to those Figures to describe the basic process steps in the laser treatment, with which the films, that is to say the laser-sensitive layer, is treated, in order to produce the multi-layer images in question. Instead of hot stamping films it is also possible to use other transfer films and in that respect the described processes are used for producing multi-layer and multi-color images in a corresponding manner.

Firstly now the various films illustrated in the Figures will be described in respect of their layer structure and the material composition of the individual layers.

The films shown in FIGS. 1 through 5 are hot stamping films. The hot stamping film in FIG. 1 includes a carrier film 1, a release layer 2, a protective layer 3, a laser-sensitive layer 4, a background layer 5 and an adhesive layer 6.

The carrier film 1 is preferably a polyester film of a thickness of between 6 and 100 μm, preferably a thickness of between 19 and 38 μm. The layers 2 through 6 are arranged in superposed relationship on the carrier film 1. They are applied using per se known processes in production of the hot stamping film.

The release layer 2 is a separation layer. It is preferably in the form of a layer which becomes soft when subjected to the action of heat and which, when the hot stamping film is applied to the substrate, permits release of the other layers from the carrier film 1. The release layer 2 is generally of a thickness of at most 1 μm.

The protective layer 3 is in the form of a protective lacquer layer. This involves a transparent lacquer layer, the purpose of which is to substantially protect the free surface of the article decorated with the hot stamping film from mechanical damage and chemical effects. The thickness of the layer is preferably between 1 and 2 μm.

The laser-sensitive layer 4 is in the form of the so-called first color lacquer layer. This involves a lacquer layer of a thickness of preferably between 3 and 10 μm, which is colored by pigments and/or provided with other coloring systems or coloring agents. The pigments or the other coloring systems or coloring agents of this color lacquer layer can be selectively bleached and/or can be changed to another color by means of a laser beam whose wavelength is preferably in the visible range. Preferably the pigment concentration of the lacquer layer 4 is between 3 and 15% with respect to solids. The binding agent system of that lacquer layer 4 may not be altered optically by the action of the laser so that, at the irradiated locations, the result is only a colored contrast marking without perceptible damage to the surface structure. In modified embodiments the laser-sensitive layer 4 has only one bleachable pigment or only one bleachable other coloring agent, that pigment or coloring agent being present as the sole pigment or coloring agent or besides other pigments or coloring agents respectively. A colored marking can also be produced by laser irradiation in such configurations. A corresponding consideration applies to modified embodiments in which, instead of the bleachable pigment or the bleachable other coloring agent, a pigment or coloring agent is used which has laser-selective color change upon laser treatment.

The background layer 5 is in the form of the so-called second color lacquer layer. This layer is colored differently from the laser-sensitive layer 4. The layer 5 is for example white or of an ivory color if the laser-sensitive layer 4 is black or gray. The layer 5 serves primarily as a light backup layer for the colors produced in the laser-sensitive layer 4 by laser radiation. The thickness of the layer 5 is preferably between 15 and 20 μm.

It is possible that the background layer 5—just like the laser-sensitive layer 4—is not provided over the entire surface area of the hot stamping film and thus not over the entire surface to be decorated, in the same coloration. On the contrary the layers 4 and 5 can be composed individually—and thus also differently—of regions of different colors.

The adhesive layer 6 involves an adhesive layer which is per se usual and known in relation to transfer films or hot stamping films, of a thickness of between about 1 and 10 μm, wherein the adhesive layer for a hot stamping film is of such a composition that it becomes sticky only when subjected to the corresponding action of heat.

The layers 2 through 6 can be produced in accordance with the following compositions:

| | |
|---|---|
| Release layer 2 (separation layer): | |
| Toluene | 99.5 parts |
| Ester wax (dropping point 90° C.) | 0.5 part |
| Protective layer 3 (protective lacquer layer): | |
| Methylethylketone | 61.0 parts |
| Diacetone alcohol | 9.0 parts |
| Methylmethacrylate (Tg = 122° C.) | 18.0 parts |
| Polyethylene dispersion (23% in xylene) (softening point 140° C.) | 7.5 parts |
| High-molecular dispersing additive (40%, amino number 20) | 0.5 part |
| Extender (aluminum silicate) | 4.0 parts |
| Laser-sensitive layer 4 (first color lacquer layer): | |
| Methylethylketone | 34.0 parts |
| Toluene | 26.0 parts |
| Ethylacetate | 13.0 parts |
| Cellulose nitrate (low viscosity, 65% in alcohol) | 20.0 parts |
| Linear polyurethane (mp. > 200° C.) | 3.5 parts |
| High-molecular dispersing additive (50%, amino number 20) | 2.0 parts |
| e.g.: Pigment Blue 15:4 | 0.5 part |
| Pigment Red 57:1 | 0.5 part |
| Pigment Yellow 155 | 0.5 part |
| Background layer 5 (second color lacquer layer): | |
| Methylethylketone | 40.0 parts |
| Toluene | 22.0 parts |
| Ethylene vinylacetate terpolymer (mp. = 60° C.) | 2.5 parts |
| Polyvinylchloride (Tg: 89° C.) | 5.5 parts |
| Polyvinylchloride (Tg: 40° C.) | 3.0 parts |
| Dispersing additive (50%, acid number 51) | 1.0 part |
| Titanium dioxide (d = 3.8-4.2 g/$cm^3$) | 26.0 parts |
| Adhesive layer 6: | |
| Methylethylketone | 55 parts |
| Toluene | 12.5 parts |

-continued

| | |
|---|---|
| Ethanol | 3.5 parts |
| Polyvinylacetate (softening point: 80° C.) | 6.0 parts |
| Butyl/methylmethacrylate (Tg: 80° C.) | 8.0 parts |
| Ethylmethacrylate resin (Tg: 63° C.) | 3.0 parts |
| Methacrylate copolymers (Tg: 80° C.) | 5.0 parts |
| Unsaturated polyester resin (softening point 103° C.) | 3.5 parts |
| Silicon dioxide | 3.5 parts |

Transfer films—in the specific case here hot stamping films—are preferably applied in a conventional manner to a substrate and more specifically in such a way that the adhesive layer 6 faces towards the substrate surface. In the hot stamping operation the adhesive layer 6 then forms an adhesive bond to the surface of the substrate. The carrier film 1 is then pulled off—after softening of the release layer 2 under the effect of heat in the hot stamping operation. With the hot stamping film applied to the surface of the substrate in that way the protective layer 3 then forms the upper surface of the stamping film, which is remote from the substrate.

Figure 2:
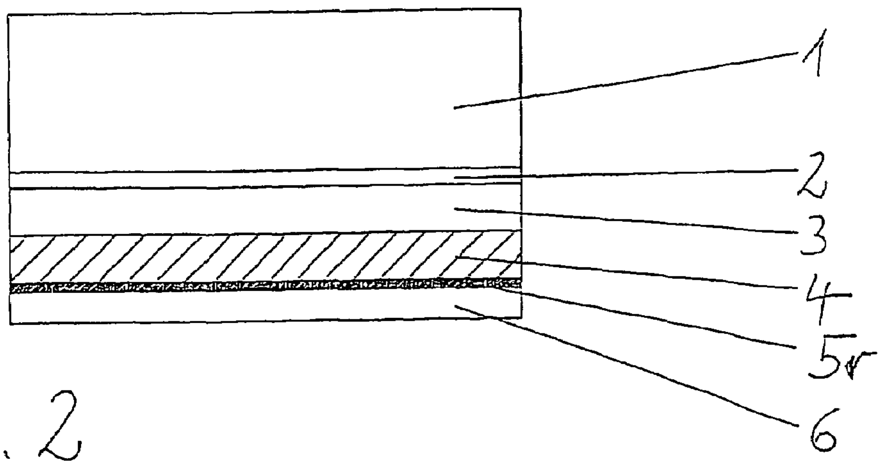
Figure 3:
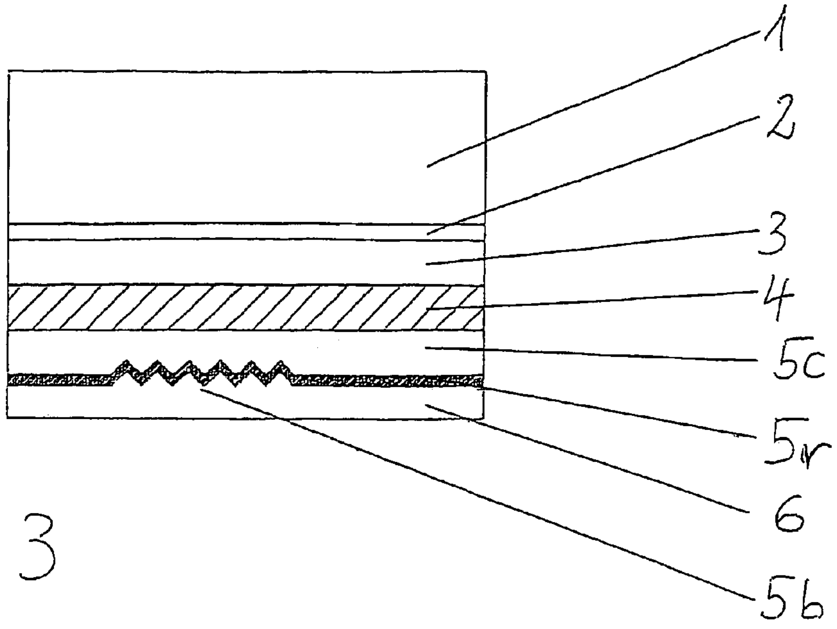
Figure 4:
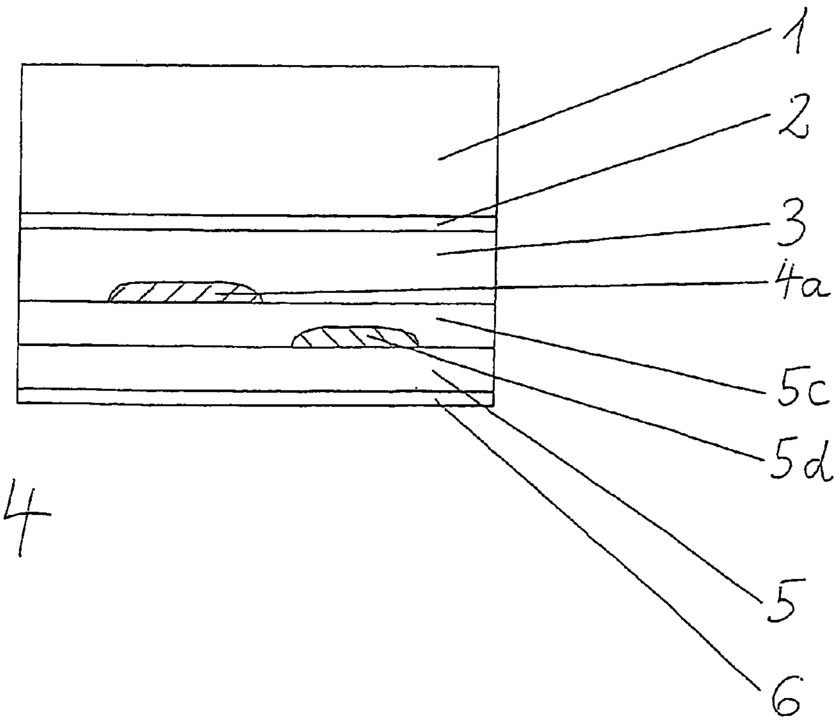

The hot stamping films shown in FIGS. 2 through 4 have a background layer which is of a different nature from the film shown in FIG. 1. In the example shown in FIG. 2 the background layer is in the form of a reflection layer 5*r*. In a special case the reflection layer is in the form of a metallic reflection layer. The reflection layer can be transparent or partially transparent for given spectral ranges. It can have a higher refractive index than the other layers and therefore has increased reflection of light. The example shown in FIG. 3 has a layer 5*c* as an additional lacquer layer which is preferably transparent. There is also a reflection layer 5*r* which has a diffraction structure 5*b* in region-wise manner. In the embodiment of FIG. 3 that structure 5*b* is in the form of a constituent of the lacquer layer 5*c* and the adhesive layer 6 as well as the interposed layer. Alternatively or in addition a diffraction structure can also be provided as a constituent of the lacquer layer 5*c* or the laser-sensitive color lacquer layer 4. In this case also the diffraction structure can be of a region-wise nature, but it can also be in the form of a continuous layer.

In the example shown in FIG. 4 a printed image 5*d* is arranged in the background layer 5*c* in a defined region and a defined laser-sensitive region 4*a* is arranged in laterally displaced relationship with the image in the laser-sensitive layer.

Figure 5:
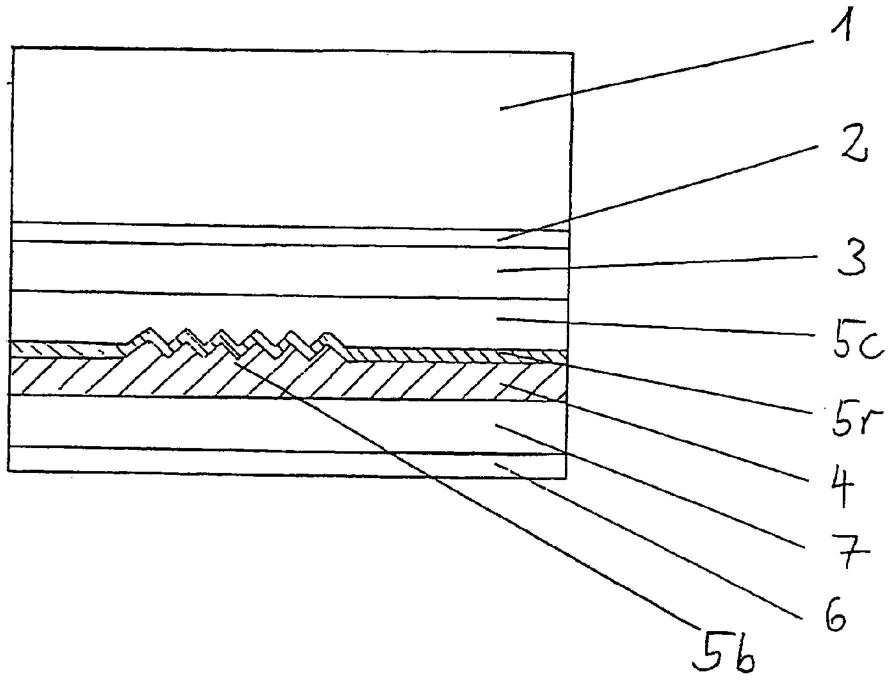

FIG. 5 shows a hot stamping film with a modified layer structure. The layer structure is similar to that in FIG. 3, but in this case the sequence of the layers is modified, more specifically in such a way that the laser-sensitive layer 4 is arranged on the side of the reflection layer 5*r*, which is towards the substrate.

The layers are disposed in the following sequence in the film of FIG. 5*a*: a carrier layer 1, a release layer 2, a protective layer 3, a laser-sensitive layer 4, a reflection layer 5*r*, a laser-sensitive layer 4, an additional lacquer layer 7 and an adhesive layer 6. The layer-sensitive layers 4 provided on both sides of the reflection layer 5*r* can be identical, that is to say the reflection layer is then arranged in that laser-sensitive overall layer. The laser-sensitive layers however can also be different. A diffraction structure 5*b* is provided in mutually adjoining regions of the laser-sensitive layers 4 and the reflection layer 5*r*. Alternatively the structure 5*b* can also be in the form of a hologram structure. In this embodiment an enhanced anti-forgery safeguard is afforded in that two laser-sensitive layers adjoin the diffraction or hologram structure respectively, which can be the same or different. In that case the lacquer layer 7 which is optional is in the form of a transparent layer or in the form of a bright backup layer. Alternatively the lacquer layer 7 and the adhesive layer 6 can also be omitted and the second laser-sensitive layer 4 shown under the reflection layer 5*r* in FIG. 5*a* can be in the form of a laser-sensitive adhesive layer.

In the case of the film in FIG. 5*b* the layers occur in the following sequence: carrier film 1, release layer 2, laser-sensitive layer 4, additional lacquer layer 5*c*, reflection layer 5*r* and adhesive layer 6. The layers 5*c* and 6 can be of identical material or of different materials. In this embodiment the laser-sensitive layer 4 is a protective lacquer layer which is laser-sensitive insofar as it contains the appropriate comparable pigments. A diffraction structure is formed in the mutually adjoining regions of the additional lacquer layer 5*c*, the reflection layer 5*r* and the adhesive layer 6. The diffraction structure can be in the form of a diffraction grating. Alternatively the structure 5*b* may also be in the form of a hologram structure.

After the transfer film, in the present case a stamping film, has been applied to the substrate, the laser treatment is effected to produce transparent and/or colored markings in the laser-sensitive layer 4. In order to produce a given color marking at a given position in the laser-sensitive layer 4, that location is irradiated with laser radiation.

In the case of the laser treatment of a film having the layer structure shown in FIG. 5 laser irradiation is effected through the reflection layer 5*r* inclusive of the diffractive structure 5*b*. The laser beam is preferably directed perpendicularly on to the plane of the film from above. The reflection layer 5*r* is transmissive in respect of the laser radiation, in particular when it is directed perpendicularly thereonto. The grating or hologram structure 5*b* of the layer forming the reflection layer 5*r* in the rest of the region is transmissive of the laser radiation, but in this respect the radiation can also be reflected more or less or in part at the diffraction structure. The laser-sensitive layer 4 which is arranged under the layer forming the reflection layer 5*r* in the rest of the region still within the diffraction structure 5*b* and therebeneath is altered by the effect of the laser insofar as a change in color is produced by bleaching at the given location.

The bleaching operation as takes place in the illustrated embodiments in the respective laser-sensitive layer is described hereinafter.

In the bleaching procedure, a blue or green or red color marking is produced in a first step, insofar as that location is irradiated with a given laser wavelength with which a given pigment component is bleached. In order to produce the color blue the yellow pigment component must be bleached. Blue laser light is used for that purpose. A given minimum intensity is required for the bleaching operation. In addition a certain pulse duration may not be exceeded.

In order to obtain a green color marking in the first step the magenta pigment component must be bleached. Green laser light is used for that purpose. In order to obtain a red marking in the first step the cyan pigment component must be bleached. Red laser light is used for that purpose.

In order to produce a color marking of the color cyan or magenta or yellow at that location, that location is subjected to laser treatment in a second step, more specifically with a laser wavelength with which one of the pigment components which is not yet bleached at that location is bleached. If a blue color marking has been produced in the first step, the cyan pigment component and the magenta pigment component are unbleached at that location. In order to produce the color cyan at that location the magenta pigment component must be bleached in this second step. That is effected with green laser light. That therefore produces a cyan-colored marking at that location.

If a magenta-colored marking is to be obtained in that second step instead of the cyan-colored marking, the blue color marking produced in the first step must be treated with red laser light. That causes the cyan pigment to be bleached at that location so that therefore the magenta pigment remains unbleached at that location. That therefore gives the magenta-colored marking at that location.

In a corresponding manner, a cyan-colored marking or a yellow-colored marking may be produced from a green color marking which was produced in the first step and which is formed from unbleached cyan pigment and yellow pigment that had remained there, that operation being effected more specifically by treatment with blue laser light and red laser light respectively.

In a corresponding manner, a red color marking produced in the first step can be converted in the second step into a yellow or magenta-colored marking, more specifically by laser treatment in the second step with green laser light and blue laser light respectively.

In order to produce, at the location treated in the first and second steps, a transparent location, that is to say a white location if the background layer 5 is white, that location must be treated in a third step with a laser beam whose wavelength is so set that the pigment component which has remained unbleached at that location after the second step is bleached, that is to say the yellow color marking must be bleached with blue light, the magenta-colored marking with green light and the cyan-colored marking with red laser light.

In the same manner, further adjacent locations are then treated in the laser-sensitive layer 4 in order to produce further color markings in the layer 4 of the stamping film. A full-color image can be produced in that way.

Laser treatment can also be used to produce color markings or a full-color image in the coloring agent or agents in the laser-sensitive layer by a color change. The laser treatment can be effected in a corresponding manner with successive process steps. Pigments fall to be considered as the coloring agents, that is to say color-imparting substances. They are mostly insoluble and they generally involve inorganic substances. However mostly soluble, organic coloring agents are considered as the coloring agents. The color change is effected in each case under specific laser conditions which are then applied in the individual steps in the laser treatment.

The described bleaching and color change process can also be used in a corresponding manner if the laser-sensitive material comprises only one or two of the coloring agent components. It is also possible to use other coloring agent components and also other laser conditions, in particular laser wavelength ranges, in the laser treatment.

The laser treatment of the transfer or stamping film for producing the color markings can also alternatively be effected prior to application of the film, more specifically in particular if the protective layer 3 is in the form of a layer which is not transparent for laser radiation or a layer which is not transparent for laser radiation in the given wavelength range, or if there is provided an additional UV-absorbent protective layer. The laser treatment is then effected prior to application of the film by a procedure whereby the laser beam is directed on to the rear side of the film, that is to say on to the background layer 5, and thus the laser-sensitive layer 4 is therefore treated from the other side in order to produce the color markings therein in the same manner. The background layer 5 and the adhesive layer 6 are transparent or at least partly transparent for the laser radiation in question, in relation to such uses.

Color markings can also be produced in laminating films in a corresponding manner. Such laminating films are shown in FIGS. 6 through 10. The laminating film in FIG. 6 includes a so-called overlay film 30, an optional intermediate layer 31, a laser-sensitive layer 40, an intermediate layer 50 which forms a background layer and which is also optional, and an adhesive layer 60. In the laminating operation the laminating film is applied to the substrate with the adhesive layer 60 towards the surface of the substrate. An adhesive bond to the surface of the substrate is produced by way of the adhesive layer 60. The overlay film 30 then forms the upper protective layer whose surface that is remote from the substrate forms the outer surface of the film. The overlay film 30 therefore remains applied there after application of the laminating film. It corresponds to the protective layer 3 of the stamping film in FIG. 1. The laser-sensitive layer 40 corresponds to the laser-sensitive layer 4, that is to say the first lacquer layer 4 of the stamping film in FIG. 1. The intermediate layer 50 corresponds to the background layer 5, that is to say the second lacquer layer 5 of the stamping film in FIG. 1. The adhesive layer 60 corresponds to the adhesive layer 6 of the stamping film in FIG. 1. The laminating films in FIGS. 7 and 8 represent modifications of the laminating film in FIG. 6, in which the background layer is modified in a corresponding manner to the background layer in the hot stamping films in FIGS. 2 and 3.

Figure 6:
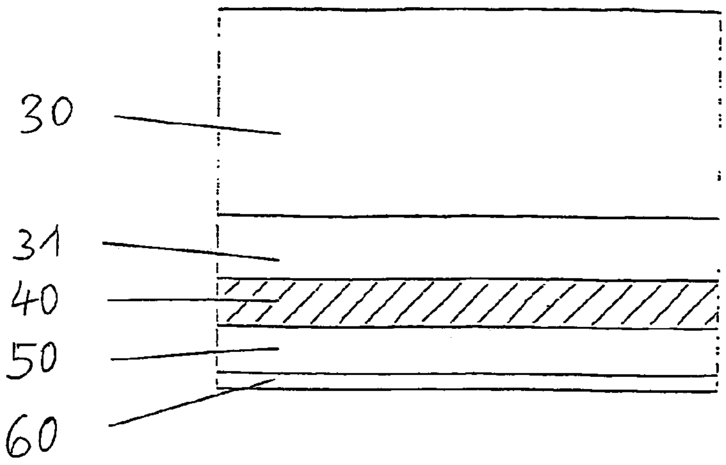
FIGS. 6 through 10 show sectional views of various laminating films each with a laser-sensitive layer, in which a multi-layer image can be produced by laser treatment.
Figure 7:
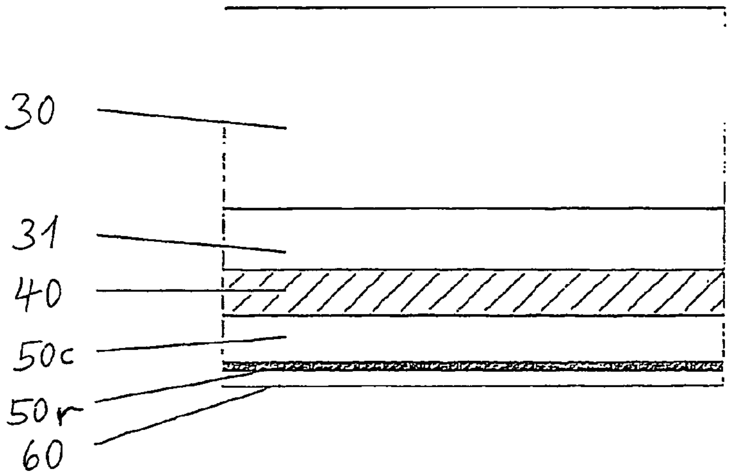
Figure 8:
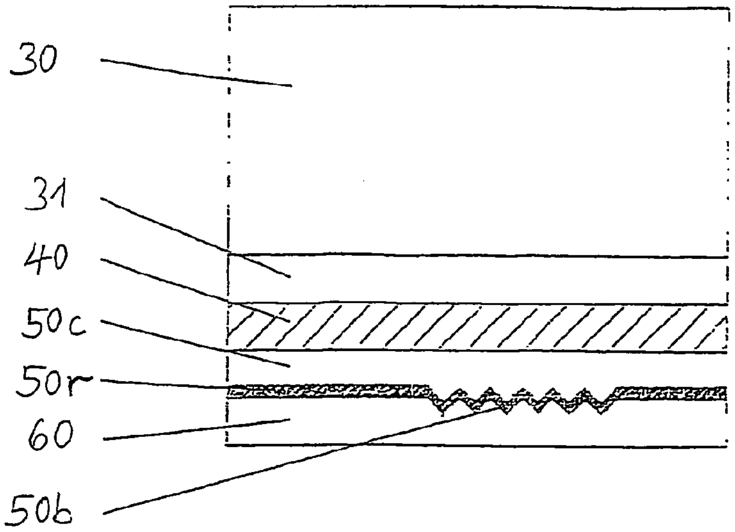
Figure 9:
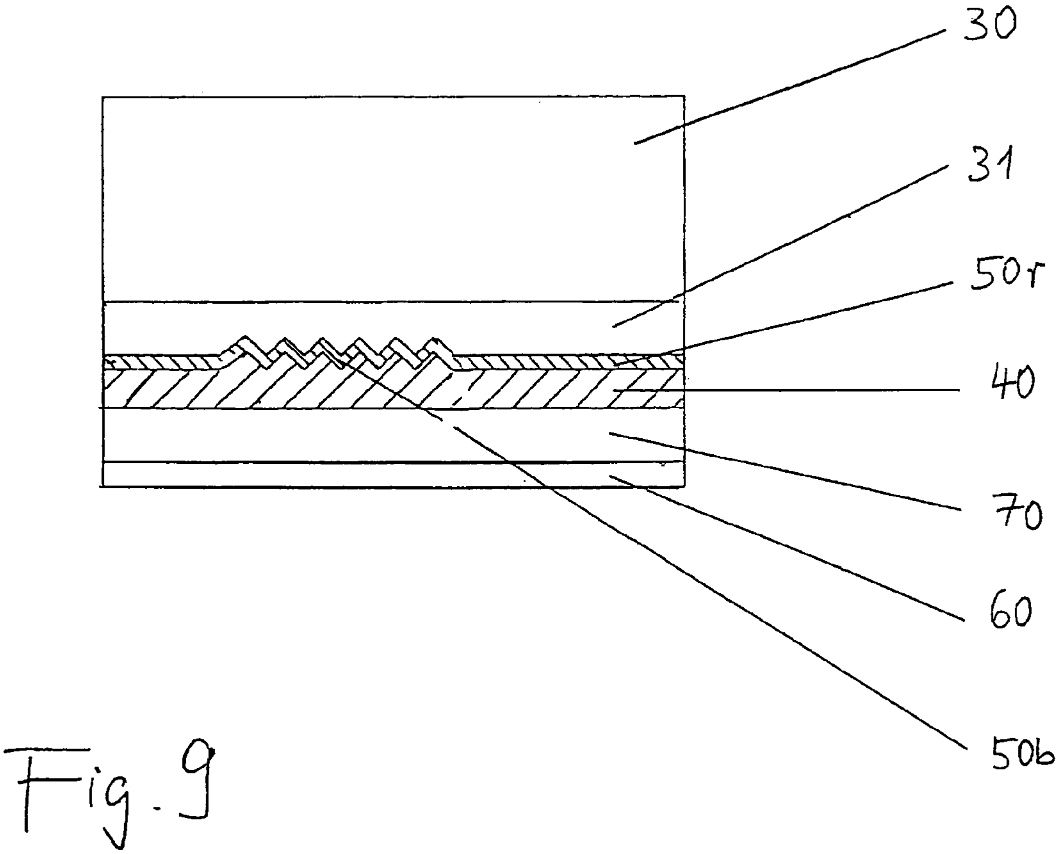

The laminating film in FIG. 9 involves a layer structure with a sequence of the mutually superposed layers, which is modified in relation to FIGS. 6 through 8. The sequence of the layers corresponds to the structure of the hot stamping film in FIG. 5. In this case the layer 70 is an optional background layer.

Figure 5A:
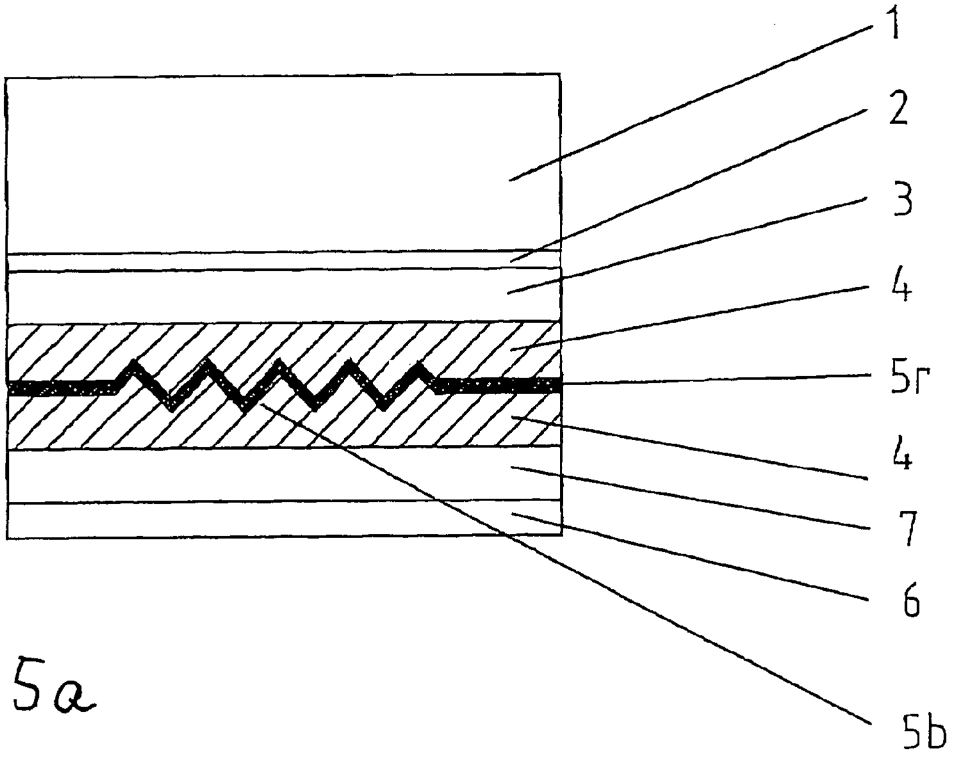
Figure 5B:
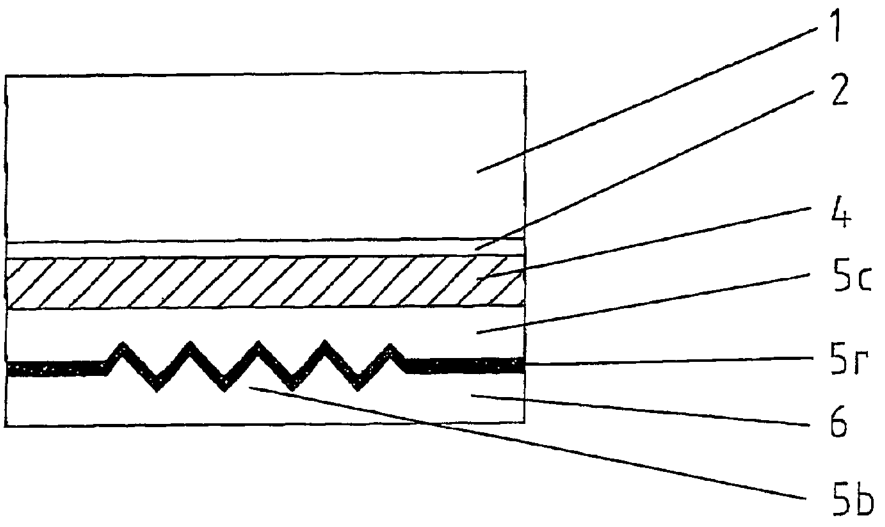
Figure 9A:
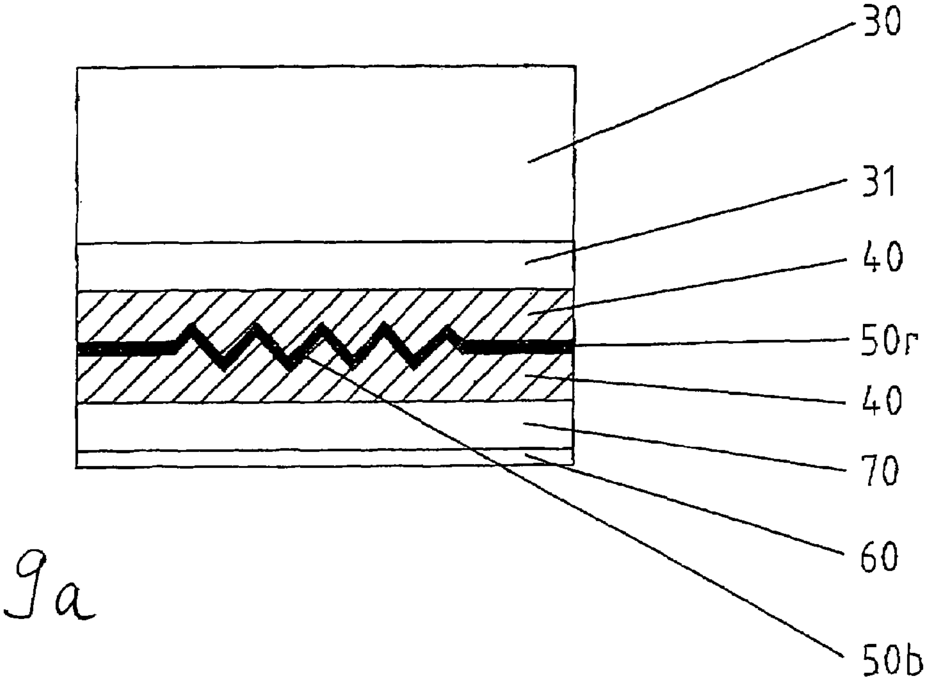

FIG. 9*a* shows an embodiment which is modified in comparison with the embodiment in FIG. 9, with a sequence of the layers corresponding to the structure of the hot stamping film in FIG. 5*a*.

Figure 10:
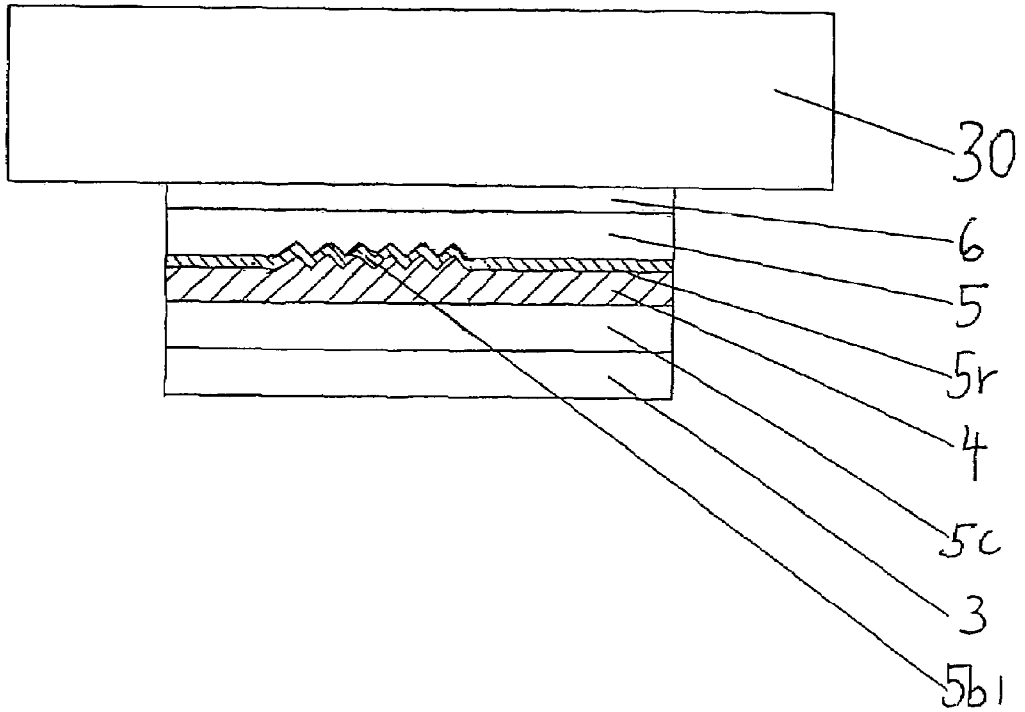

The laminating film in FIG. 10 represents a modification of the laminating film in FIG. 9. In this embodiment the overlay film 30 is provided with a hot stamping film applied thereto. That hot stamping film applied at that location replaces the layers 31, 50 and 50*r*, 40, 70 and 60 which are provided in the laminating film in FIG. 9, by the corresponding layers of the hot stamping film. In the case of the hot stamping film used for production of that laminating film, unlike the stamping film in FIG. 5, the reflection layer 5*r* and the laser-sensitive layer 4 are arranged in the reverse sequence so that, in the case of the laminating film in FIG. 10, the reflection layer 5*r* is now arranged on the side of the laser-sensitive layer 4, which is remote from the substrate, in a corresponding manner to the laminating film in FIG. 9. In the same manner as in the other illustrated embodiments the diffraction structure 5*b* in the laminating film in FIG. 10 is also provided in the mutually adjoining regions of the layers 4 and 5. In this arrangement the lacquer layer 5 is in the form of a transparent layer.

Figure 10A:
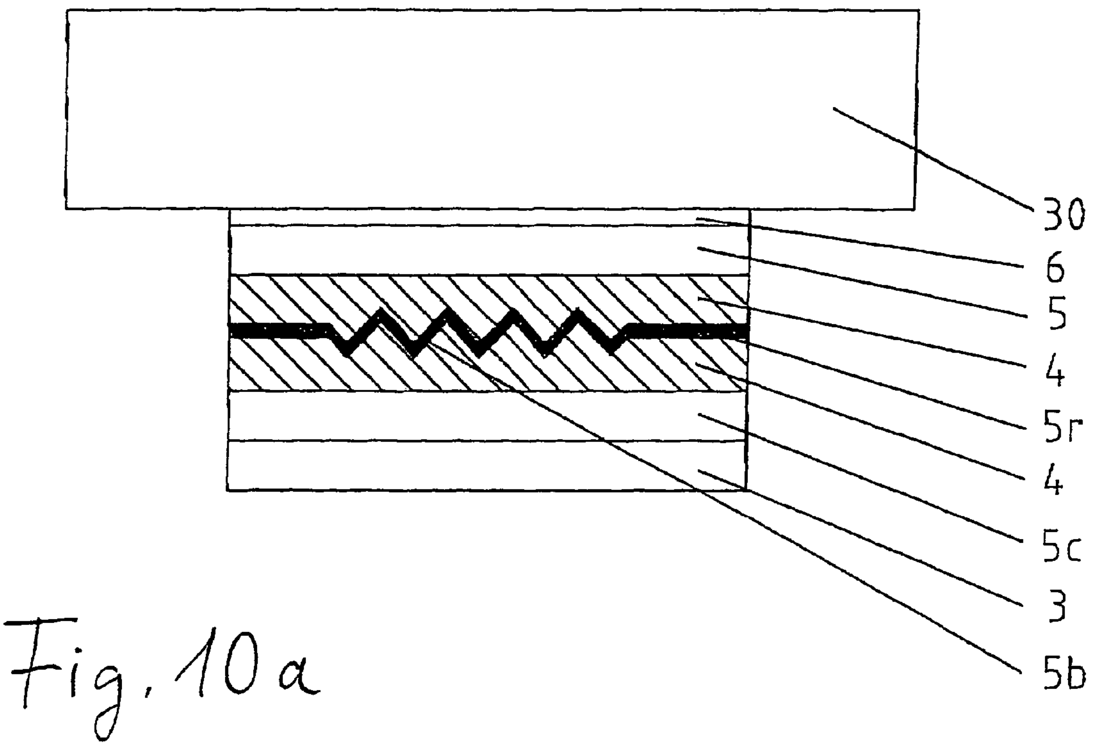

The laminating film in FIG. 10*a* is of a similar structure to the laminating film in FIG. 10. In the embodiment in FIG. 10*a* however the overlay film 30 is provided with a hot stamping film applied thereto, which is of a similar structure to the hot stamping film of the embodiment in FIG. 5*a*. That hot stamping film which is applied to the overlay film 30 replaces the layers 31, 40, 50, 50*r*, 40, 70 and 60 which are provided in the laminating film in FIG. 9*a*, by the corresponding layers of the hot stamping film. The laminating film in FIG. 10*a* involves a series of layers in the following sequence: overlay film 30, adhesive layer 6, optional lacquer layer 5, laser-sensitive layer 4, reflection layer 5*r*, laser-sensitive layer 4, additional lacquer layer 5*c* and protective layer 3. The laser-sensitive layers 4 on both sides of the reflection layer 5*r* can be identical, that is to say the reflection layer 5*r* is then arranged in that laser-sensitive overall layer. The laser-sensitive layers 4 however may also be different. In that case the lacquer layer 5 is in the form of a transparent layer or a bright backup layer.

Figure 10B:
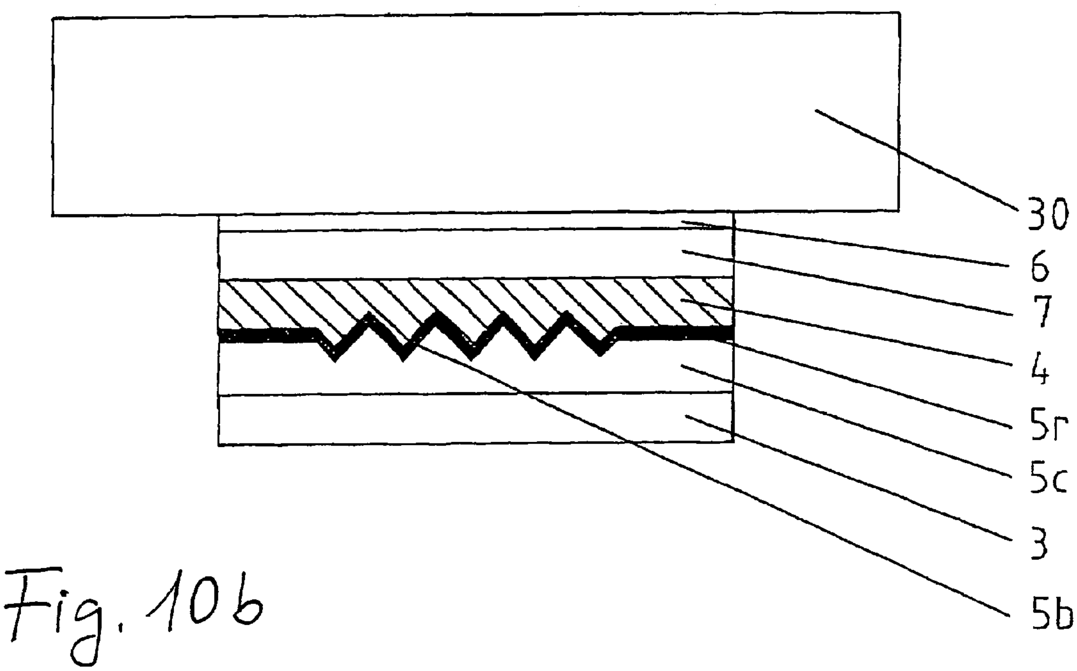

The laminating film in FIG. 10*b* represents an embodiment in which a hot stamping film is also applied on the overlay film 30. That applied hot stamping film is of a similar configuration to the film in FIG. 5. It replaces the layers 31, 40, 50 and 50*r*, 40, 70 and 60 respectively provided in the laminating film in FIG. 9*a* by the layers of the hot stamping film. The laminating film in FIG. 10*b* has a series of layers involving the following sequence: overlay film 30, adhesive layer 6, optional lacquer layer 7, laser-sensitive layer 4, reflection layer 5*r*, additional lacquer layer 5*c* and protective layer 3.

The laser treatment of the laminating film is implemented in a corresponding manner to that described for the transfer film, that is to say by appropriate successive bleaching or laser-sensitive color change of the coloring agents contained in the laser-sensitive layer 40, that is to say pigment components or other laser-sensitive coloring agents.

Described hereinafter now are embodiments, illustrated in FIGS. 11 through 30, of multi-layer images which can be produced by the described laser treatment, using the various films as are shown in FIGS. 1 through 10. The illustrated multi-layer images are respectively composed of a laser-induced image component produced in the laser-sensitive layer and an image component formed by the background layer or a foreground layer arranged thereover. FIGS. 11 through 30 which show the various embodiments by way of example of the multi-layer images produced show, insofar as they involve sectional views, each in highly diagrammatic form, the laser-sensitive layer 4 in an upper or lower film layer arrangement and the background layer 5 arranged therebeneath or thereabove respectively in a lower and an upper film layer arrangement respectively. The diagrammatic drawings each show only one laser-sensitive layer 4 of the upper and lower film layer arrangement respectively and only one background layer 5 of the lower and upper film layer arrangement respectively. Any further layers in those film layer arrangements and optional layers arranged therebetween as well as layers disposed thereover and therebeneath and possible further film layer arrangements are not shown for the sake of simplicity. Preferably the reflection layer is arranged directly on or under the laser-sensitive layer.

Figures 11A, 11B, 11C, 11D:
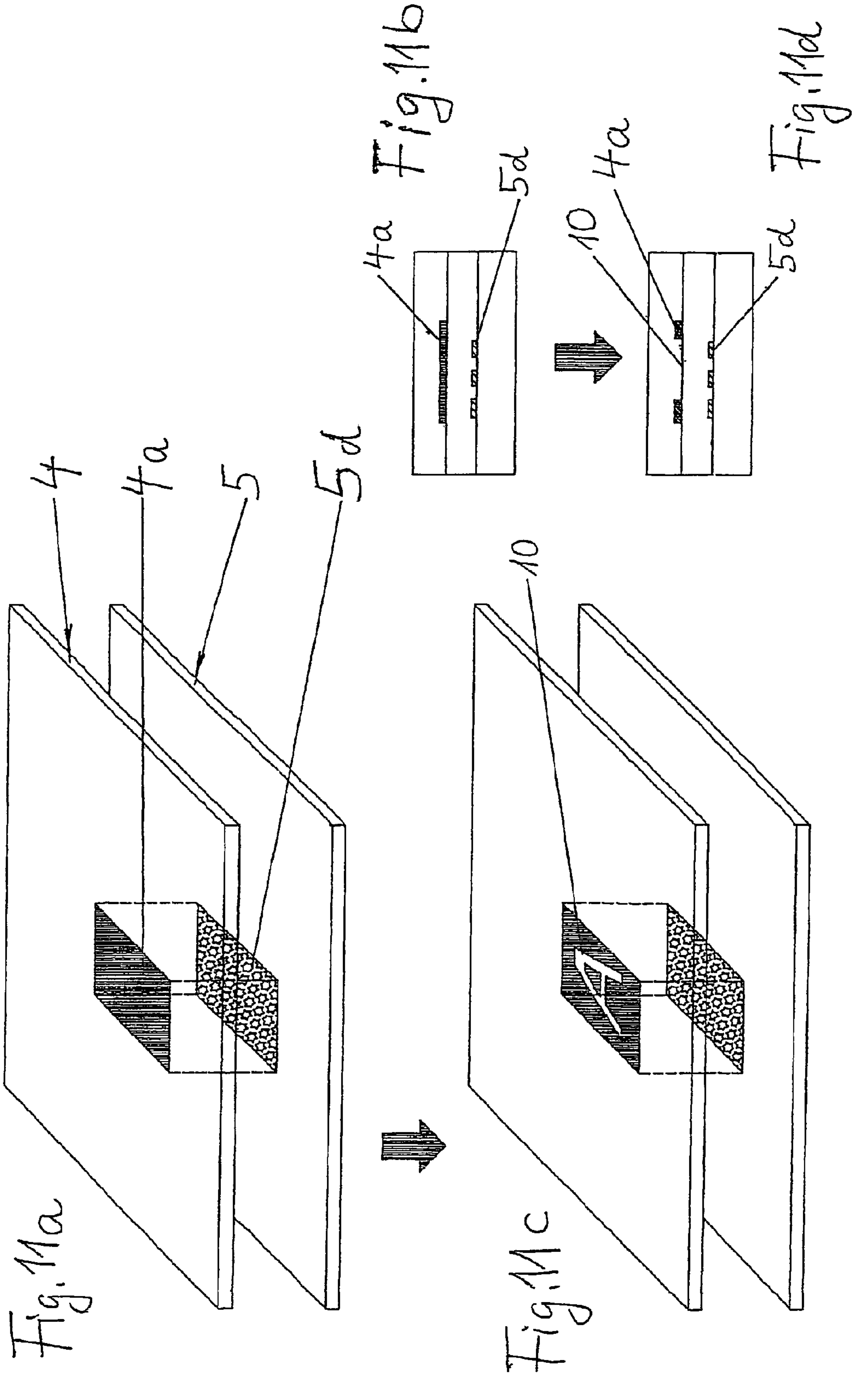
FIGS. 11*a* through *d* show perspective views (a and c) and sectional views (b and d) of a first embodiment of a multi-layer image produced by laser treatment, wherein FIGS. 11*a* and *b* respectively show the configuration in the region of the laser-sensitive layer and the background layer prior to the laser treatment and FIGS. 11*c* and *d* respectively show same after the laser treatment.

The first embodiment in FIGS. 11*a* through d is based on a film in which the laser-sensitive material is present in a film layer arrangement in the layer 4 in a limited region 4*a*. The region 4*a* is an area which is rectangular in plan in FIGS. 8*a, b* which show the condition prior to the laser treatment. In modified embodiments the laser-sensitive material can also be provided over the full area, over a larger region of the film layer arrangement. In the illustrated embodiment the background layer 5 has a printed image 5*d* which is arranged in a film layer arrangement under the laser-sensitive region 4*a*. The laser-sensitive region 4*a* covers over the printed image 5*d*. The laser-sensitive layer is in the form of a completely or more or less completely optically covering layer so that the printed image 5*d* arranged therebeneath is not visible or is only more or less translucently visible prior to the laser treatment from above. The laser-sensitive material is preferably black or gray and involves an in particular dark, at any event more or less covering color. By laser treatment of the film, starting from the condition as is shown in FIGS. 11*a* and *b*—the laser irradiation procedure is effected from above in the direction of the arrow in FIG. 11—a marking—in the example in FIGS. 11*c* and 11*d* a transparent marking in the form of an A—is produced in the laser-sensitive layer, that is to say in the region 4*a*, by laser-induced bleaching or laser-induced color change. The subjacent printed image 5*d* is freely visible through that marking in the region of the marking, or is more or less translucently visible. That therefore provides a marking which—depending on the color or configuration of the printing 5*d* and the respective degree of transparency or shading of the marking region in the layer 4*a*—can involve any color or colored configuration. At any event this affords an image which is combined from a laser-induced image component and an image component formed by the background layer. In the embodiment illustrated in FIG. 8 the laser-induced image component is a negative image comprising a region 10 which is more or less transparent by virtue of the laser treatment and a non-laser-treated covering region, arranged around the region 10, of the laser-sensitive layer 4*a*. The other image component is formed by the region of the background layer, which is exposed by virtue of the change in the laser-sensitive layer, that is to say the exposed region of the printed image 5*d*.

Figure 12:
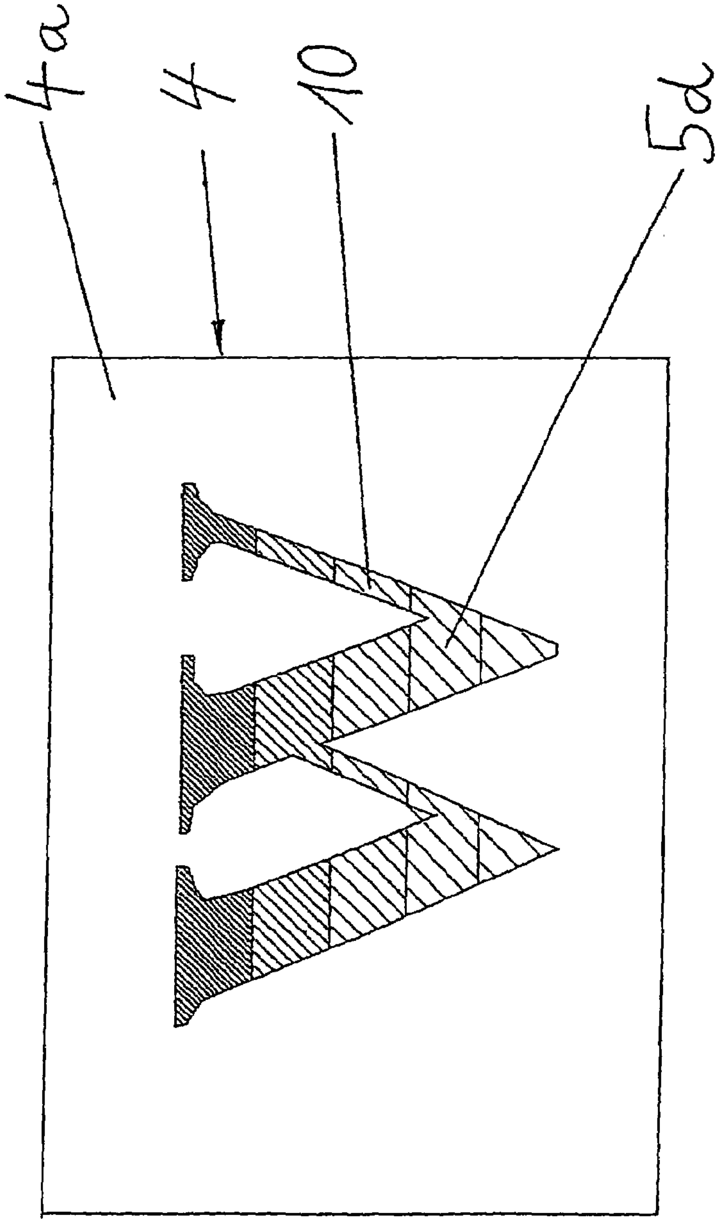
FIG. 12 shows a plan view of a second embodiment of a multi-layer image.
Figures 13A, 13B, 13C, 13D:
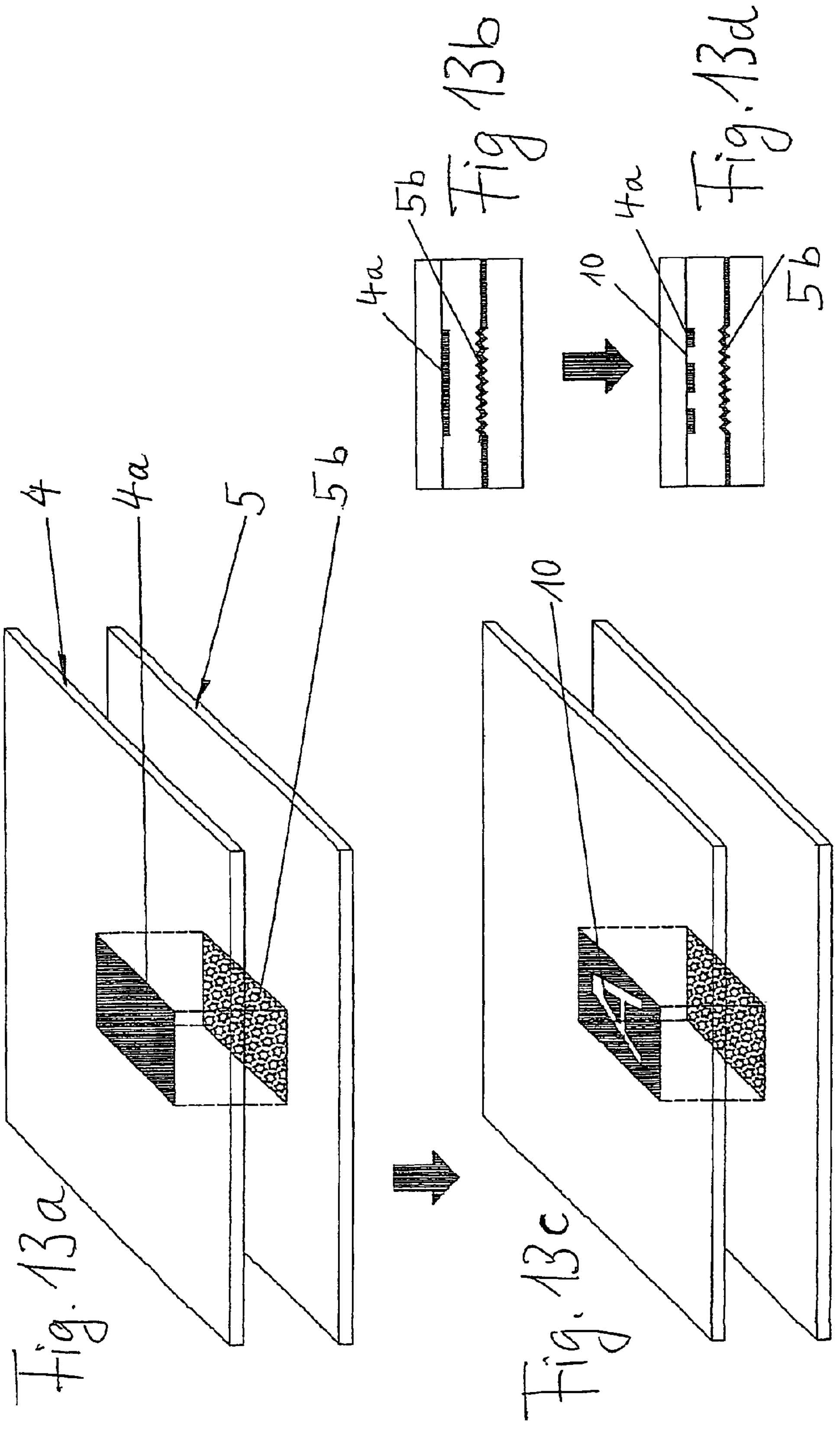
FIGS. 13*a* through *d* through 24*a* through d show perspective views (a and c) and sectional views (b and d) of a third through thirteenth embodiment of multi-layer images produced by laser treatment, wherein Figures a and b respectively show the configuration in the region of the laser-sensitive layer and the background layer prior to the laser treatment and Figures c and d respectively show same after the laser treatment, FIGS. 25*a* and *b* show plan views of the embodiments in FIG. 24, FIGS. 26*a* through d show perspective views corresponding to FIG. 13 of a fourteenth embodiment.
Figures 14A, 14B, 14C, 14D:
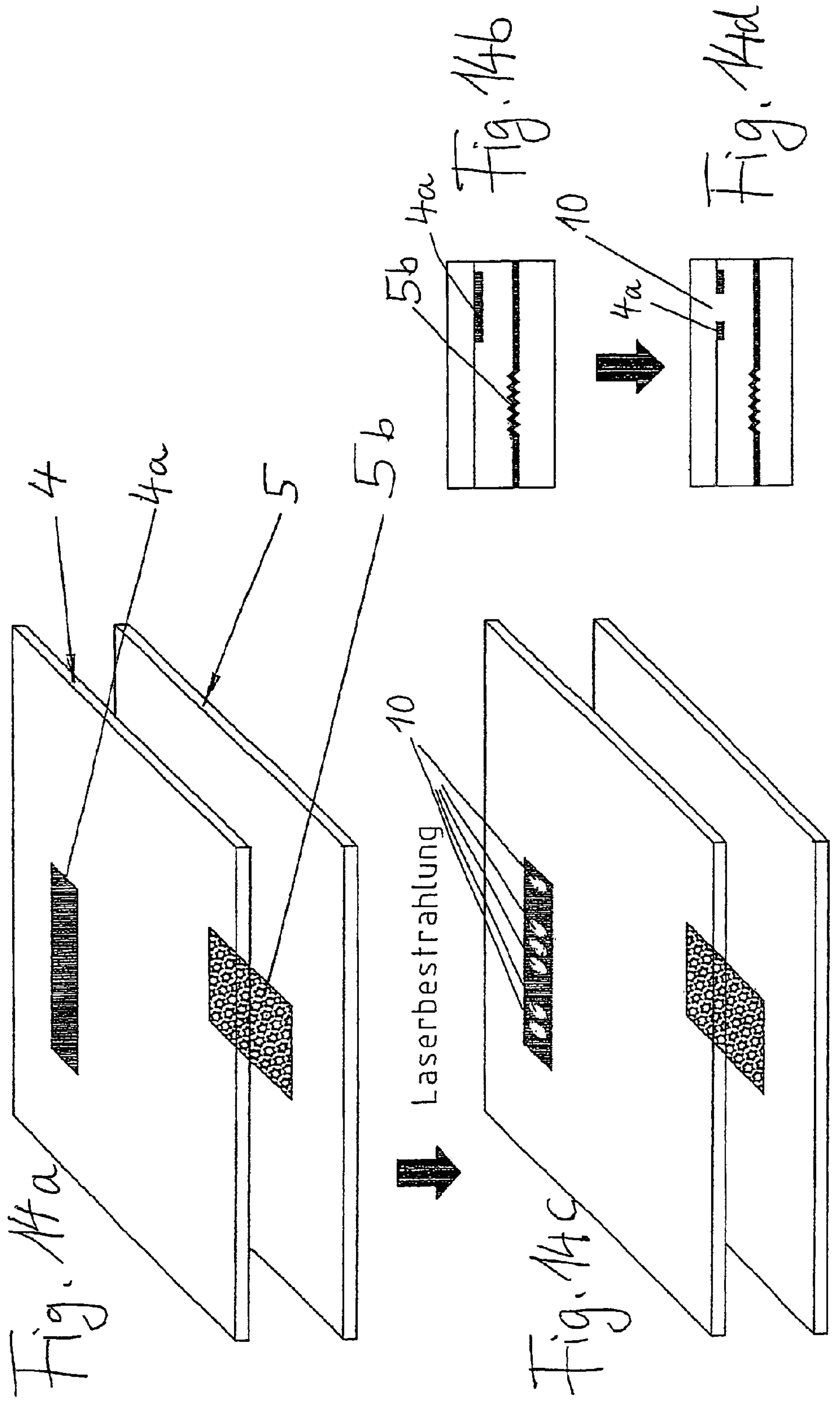

The embodiment illustrated in FIG. 12 is an image which is produced in a corresponding manner. The only difference in relation to the embodiment of FIGS. 11*a* through d is that, in FIG. 12, the printed image 5*d* produced in the background layer involves a color pattern and the marking with color pattern is thus visible through the laser-treated region.

The third embodiment which is shown in FIGS. 13*a* through 13*d* is also produced and constructed in a corresponding manner to the embodiments illustrated in FIGS. 11 and 12. The only difference in relation to the embodiment in FIGS. 11*a* through d is that, instead of a printed image 5*d*, the background layer has a diffraction pattern 5*b*. The diffraction pattern 5*b* can be produced in a metal layer with a suitable surface structure and/or can be formed in a lacquer layer and backed with a metal layer. The embodiment of FIGS. 13*a* through 13*d* has a particularly attractive optical effect by virtue of the diffraction pattern 13*b* visible in the region of the marking 10. That affords the possibility of producing individualised diffraction patterns as the diffraction structure is visible only in the region of the laser-induced image component. In modified embodiments the laser-sensitive region 4*a* and the diffraction pattern 5*b* can be arranged in mutually laterally displaced relationship, that is to say not in aligned relationship one above the other, as in the embodiment in FIGS. 13*a* through 13*d*. Such an embodiment is illustrated in FIGS. 14*a* through 14*d*. The background layer 5*c* and 50 respectively has a diffraction pattern in a limited region 5*b* and in the entire region is in the form of a reflecting layer or has a reflecting layer. The region with the diffraction pattern 5*b* is not arranged in alignment below the laser-sensitive region 4*a* but is arranged in laterally displaced relationship in a direction of view perpendicularly to the plane of the film. In aligned relationship under the laser-sensitive region 4*a* the reflection layer does not have a diffraction pattern 5*b* but a region which is metallically matt or metallically shiny. Various markings 10 are produced by means of the laser in the laser-sensitive region 4*a*, more specifically by laser-induced bleaching or laser-induced color change. The laser-treated regions 10 in question thereby become more or less transparent. By virtue of the laterally displaced arrangement of the diffraction structure, depending on the respective viewing angle, it is possible to achieve different effects, in particular different color configurations in the region of the markings 10. It is thus possible to produce special coding effects.

In the described embodiments shown in FIGS. 11 through 14 laser markings 10 can be produced in a simple manner of any desired configuration by suitably guiding the laser beam in the laser treatment. It is possible to produce letters, that is to say scripts or texts of any configuration and size, for example also including given individual script strokes and characters. The markings however can also be in the form of any graphic shapes. Markings with a different degree of bleaching at different locations or multi-color markings can be produced by using different laser conditions in different regions of the marking.

In addition, embodiments corresponding to FIGS. 11 through 14 are possible as a lottery film, insofar as for example the winning total is printed in the background layer 5 in production of the film, and the film layer arrangement with the laser-sensitive layer is applied thereover. Alternatively the winning total can also be printed on the substrate to which the film is applied. A suitable laser device, that is to say involving specific laser conditions, can then be used to bleach out the laser-sensitive layer so that the winning total becomes visible.

Figures 15A, 15B, 15C, 15D:
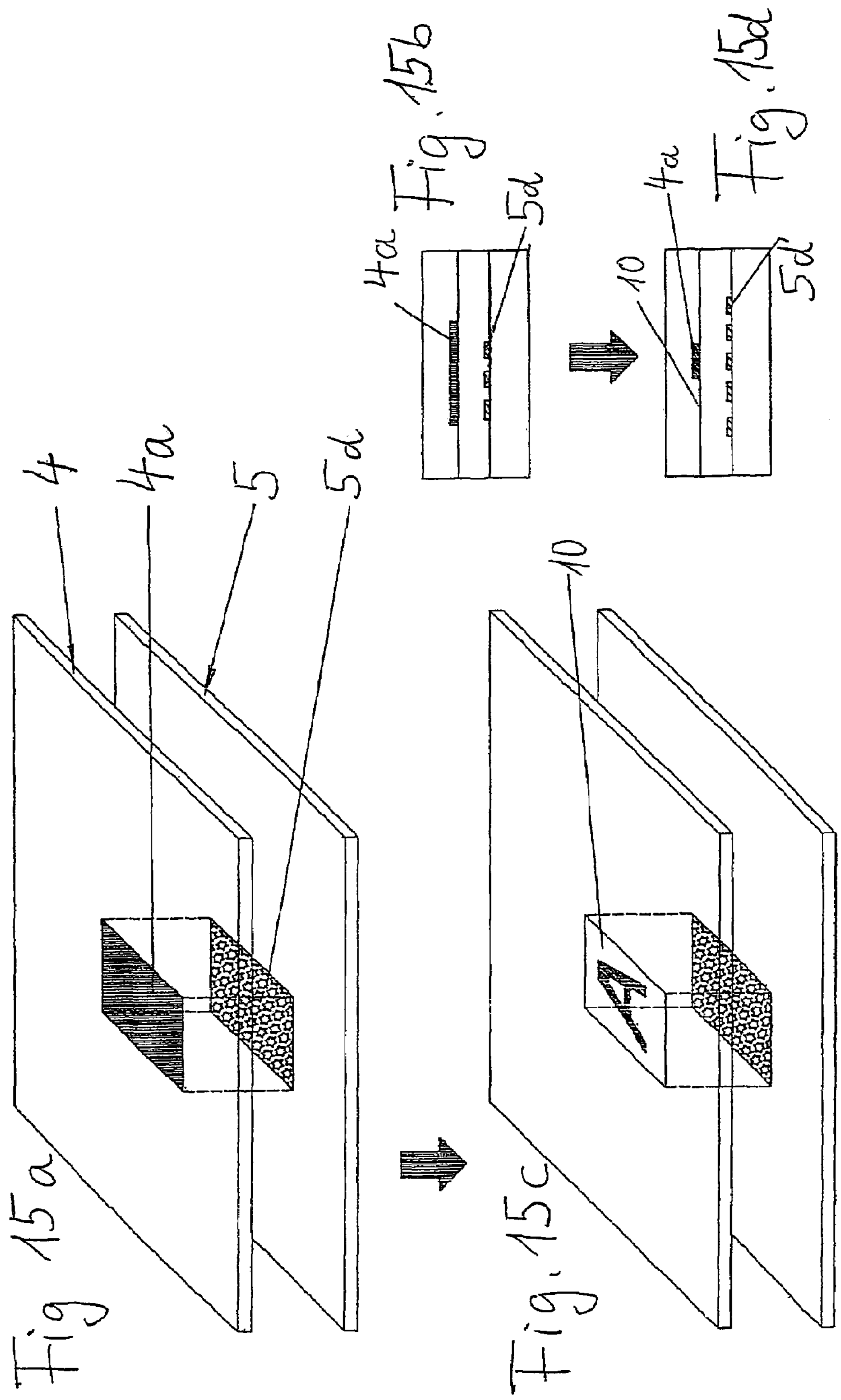
Figures 16A, 16B, 16C, 16D:
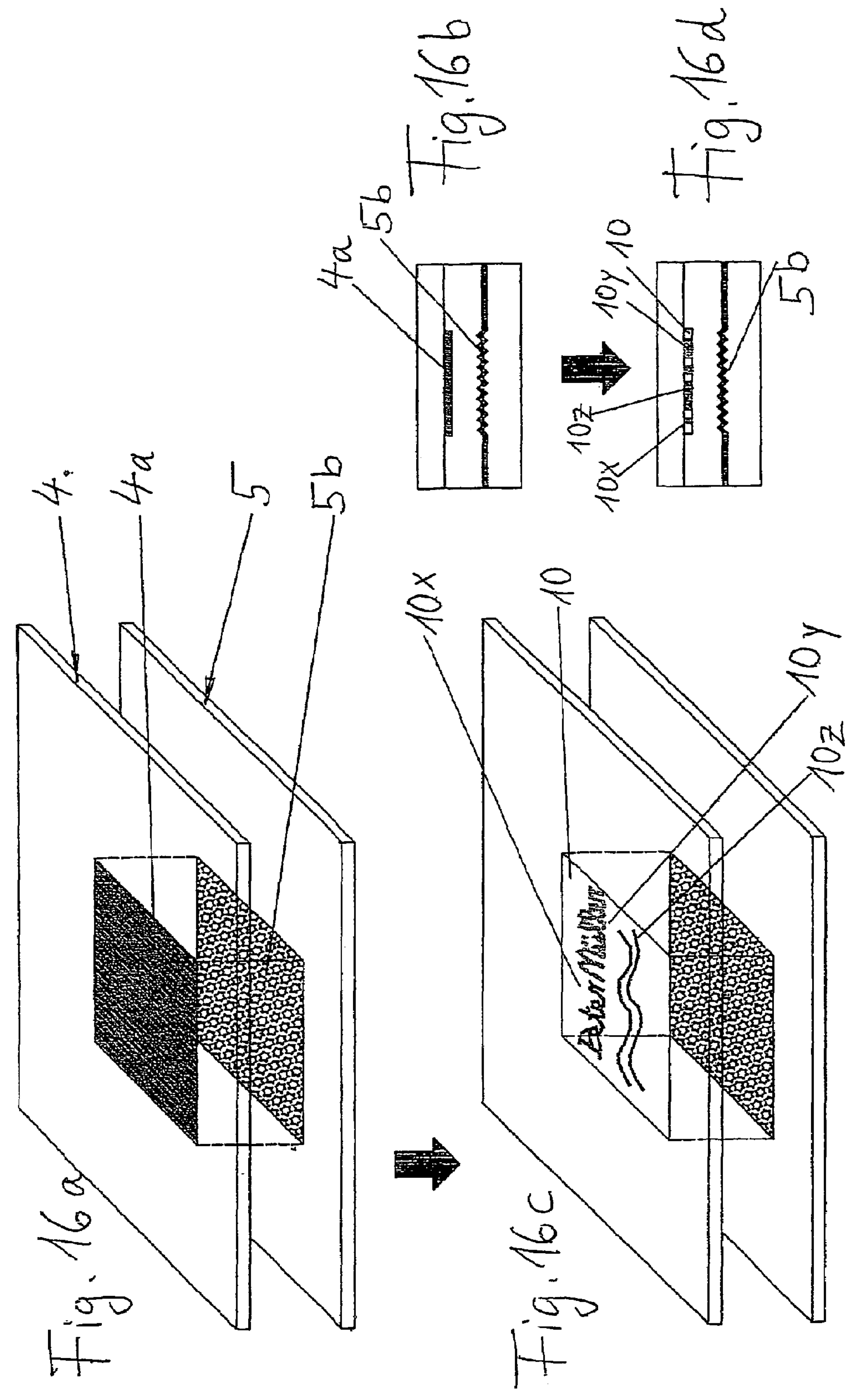
Figures 17A, 17B, 17C, 17D:
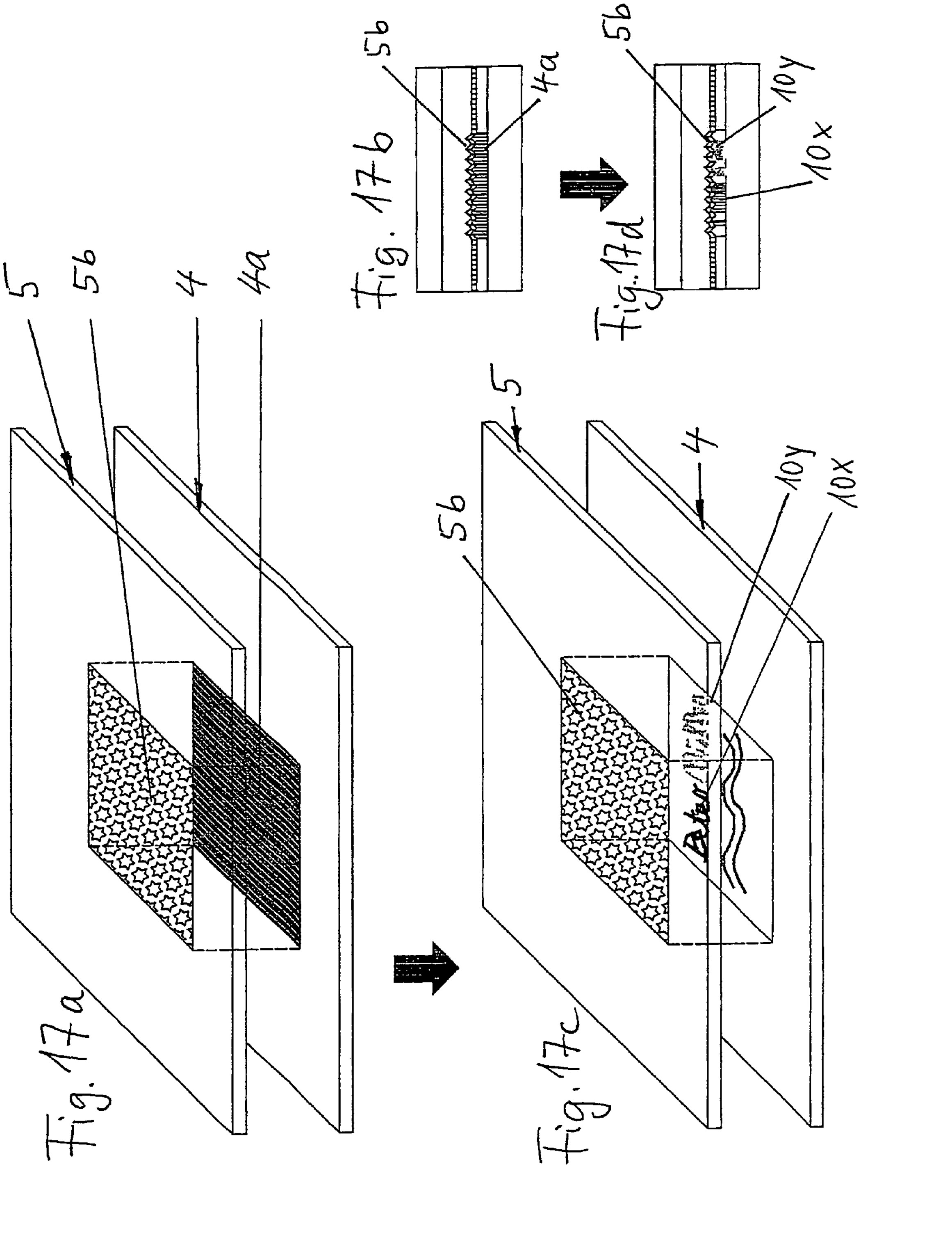

In the embodiment illustrated in FIGS. 15*a* through 15*d*, the basic starting point adopted, in FIGS. 15*a* and 15*b*, is a layer structure which also corresponds to the layer structure in the above-described embodiment of FIGS. 12 through 14. As a difference in relation thereto however, in the embodiment in FIGS. 15*a* through 15*d*, an outer region which surrounds the marking is subjected to laser treatment in the laser-sensitive layer 4*a*. The region becomes transparent or partly transparent by bleaching or color change. In this embodiment therefore the image produced, as is shown in FIGS. 15*c* and *d*, is composed of an untreated remaining region 10*r* which has remained in the laser-sensitive layer—being in the form of a letter A in FIGS. 15*c* and *d*—and an outer region which is transparent by virtue of the bleaching of the rest of the laser-sensitive region 10 and through which the printed image 5*d* is visible.

In the embodiment in FIGS. 16*a* through 16*d* the marking is produced in a similar manner to that described for the embodiment of FIGS. 15 through 15*d*. In this case the laser-sensitive layer 4*a* is for example in the form of a green covering layer. Different colored markings 10*x*, 10*y*, 10*z* are produced by selective bleaching at different laser wavelengths. The green laser-sensitive layer will be altered by irradiation with laser light in the blue spectral range towards blue, by irradiation with laser light in the red spectral range towards yellow. By successive or simultaneous application of both wavelengths the outer region 10 is completely bleached, that is to say it is in the form of a transparent region. In the illustrated embodiment the image produced is a name text comprising a name component 10*x* and a name component 10*y*, underlined by a line structure 10*z*. The first word 'Peter' can be produced with the above-described process as blue text and the second word, in this case 'Müller' as yellow text and the line structure can be produced as green lines. The region 10 arranged around those markings is completely bleached so that, in that region, the diffraction pattern 5*b* arranged in the background layer or optionally printing or the like appears visible.

The embodiment in FIGS. 17*a* through 17*d* is modified in relation to that of FIGS. 16*a* through 16*d* in that the laser-sensitive layer 4 is arranged at the side of the diffraction structure 5*b*, which is towards the substrate, and thus the diffraction structure engages over the laser-induced marking 10. That affords an enhanced level of safeguard against forgery, in particular if the laser-sensitive layer with the laser-induced marking provided therein directly adjoins the diffraction structure 5*b* or is part of the diffraction structure itself.

Figures 18A, 18B, 18C, 18D:
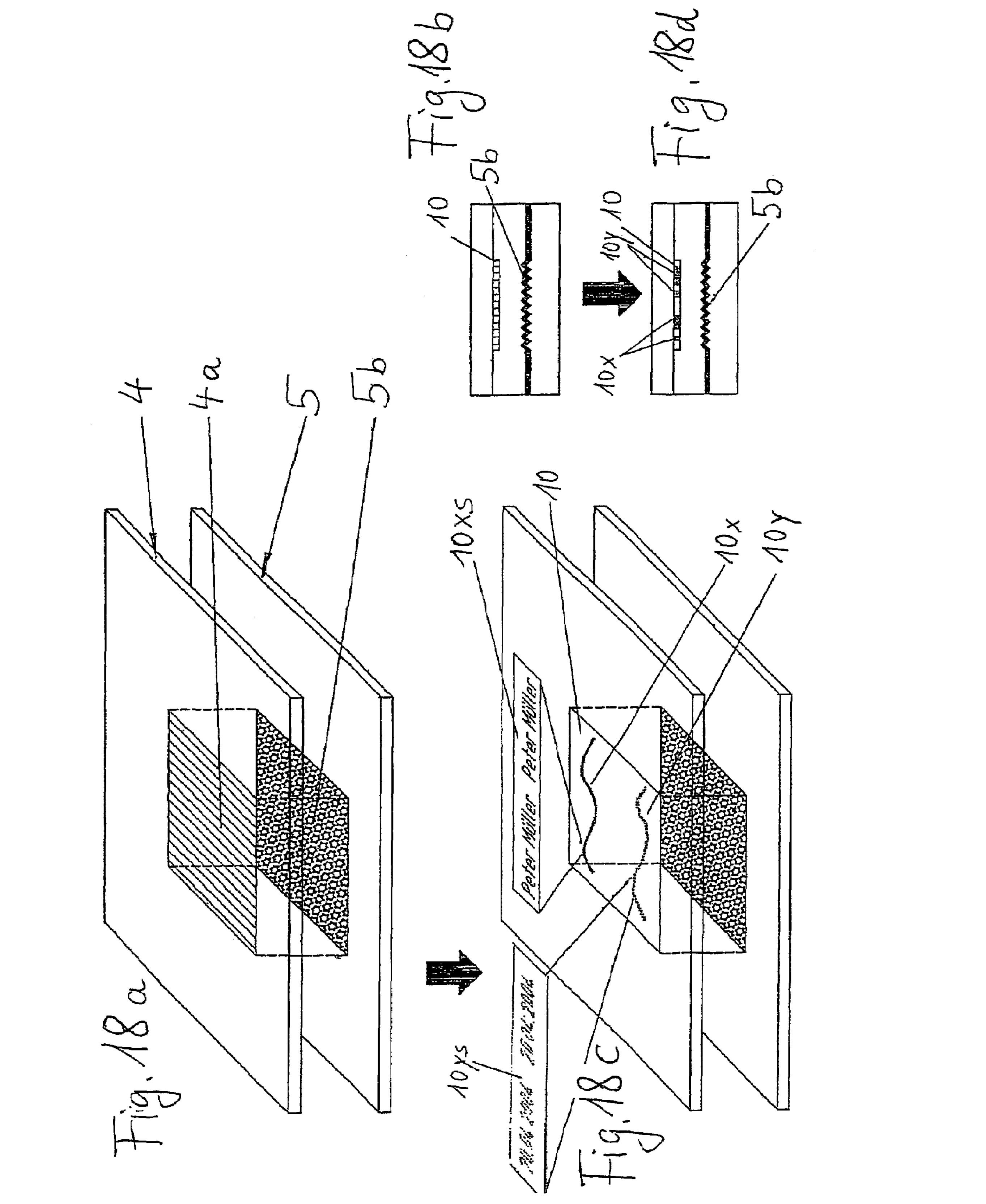

In the embodiment illustrated in FIGS. 18*a* through 18*d*, the basic starting point adopted in FIGS. 18*a* and 18*b* is a film in which the laser-sensitive layer 4*a* is translucently green. The water mark-like image shown in FIGS. 18*c* and *d* can be produced by selective bleaching or selective color conversion. It comprises a translucently colored line structure, more specifically a translucently blue line 10*x* and a translucently yellow line 10*y*. The line in question is formed by an individualised microscript 10*xs*, 10*ys*. The line 10*x* can also be formed by blue microscript and the line 10*y* by yellow microscript. In the illustrated embodiment the translucently blue line 10*x* is to comprise the name 'Peter Müller' which is written in the microscript and which is arranged in a successive row in the line and the translucently yellow line 10*y* is to comprise the date '20.4.2000' which is arranged in a row in microscript in the line—or any other personal data—. The region of the laser-sensitive layer 4*a* in the region outside the lines 10*a* and 10*b* is completely bleached by laser-induced treatment in the illustrated embodiment, but it can also stand out translucently shaded in another color from the line structure, by virtue of suitable specific laser treatment.

Figures 19A, 19B, 19C, 19D:
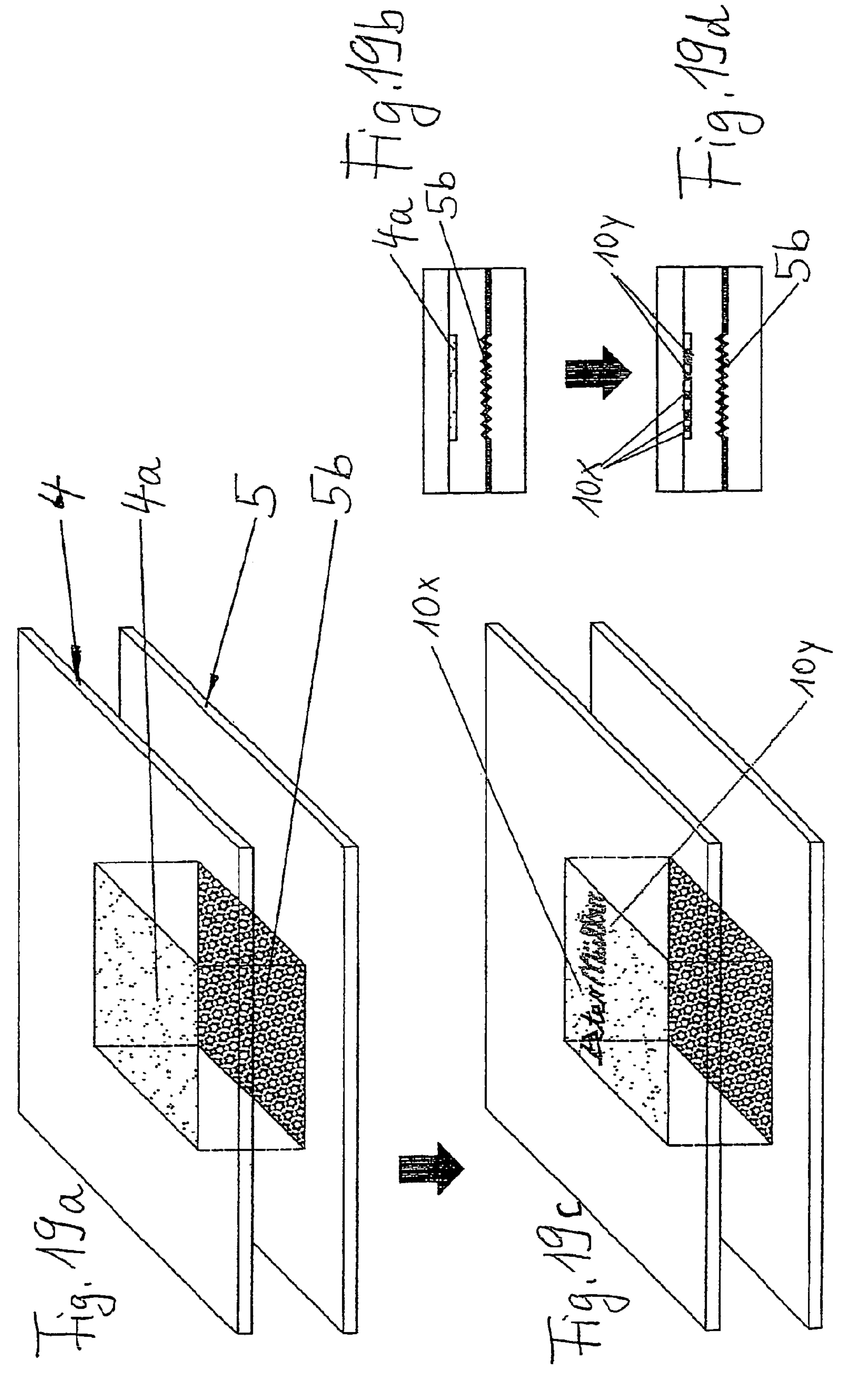
Figures 20A, 20B, 20C, 20D:
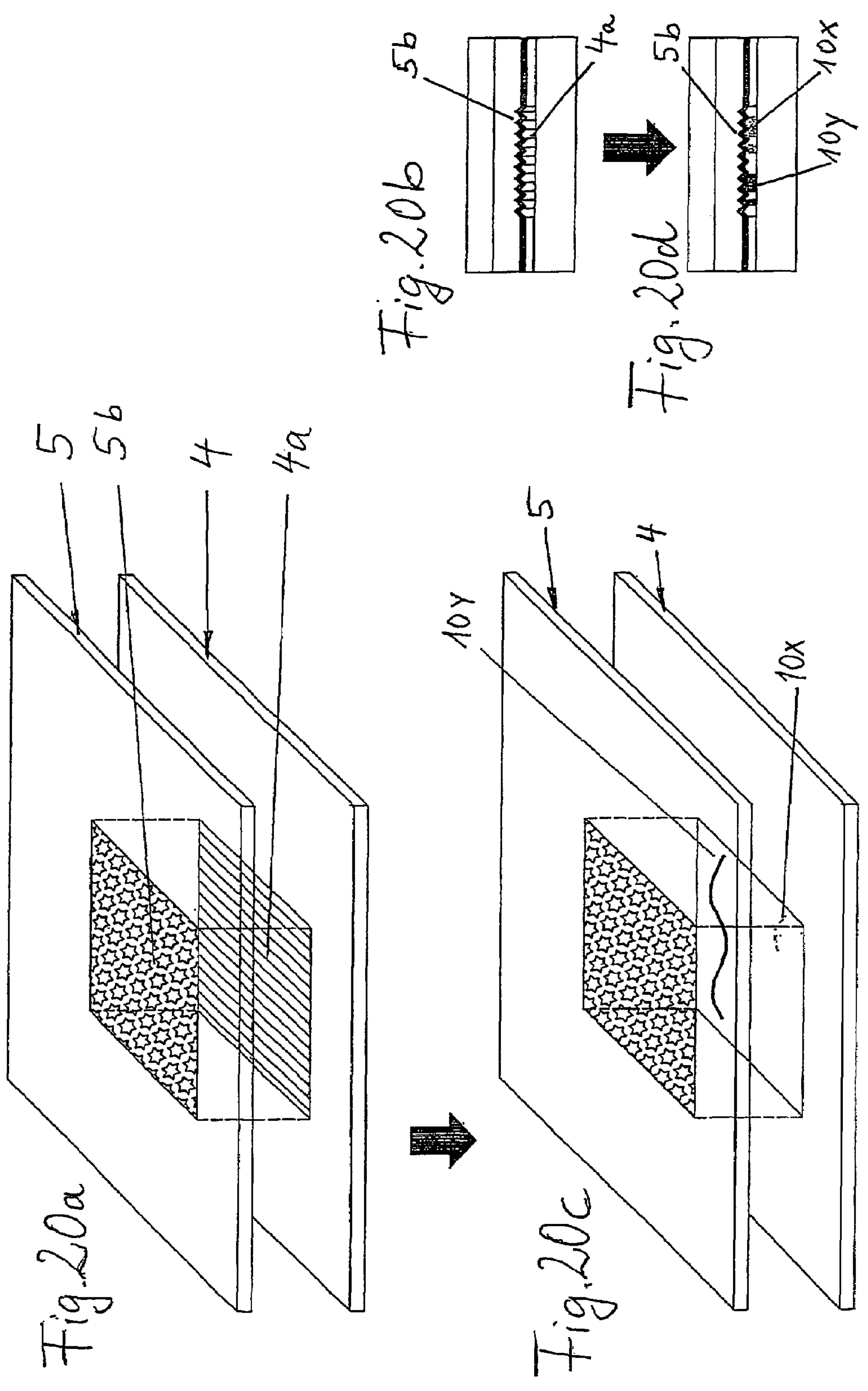
Figures 21A, 21B, 21C, 21D:
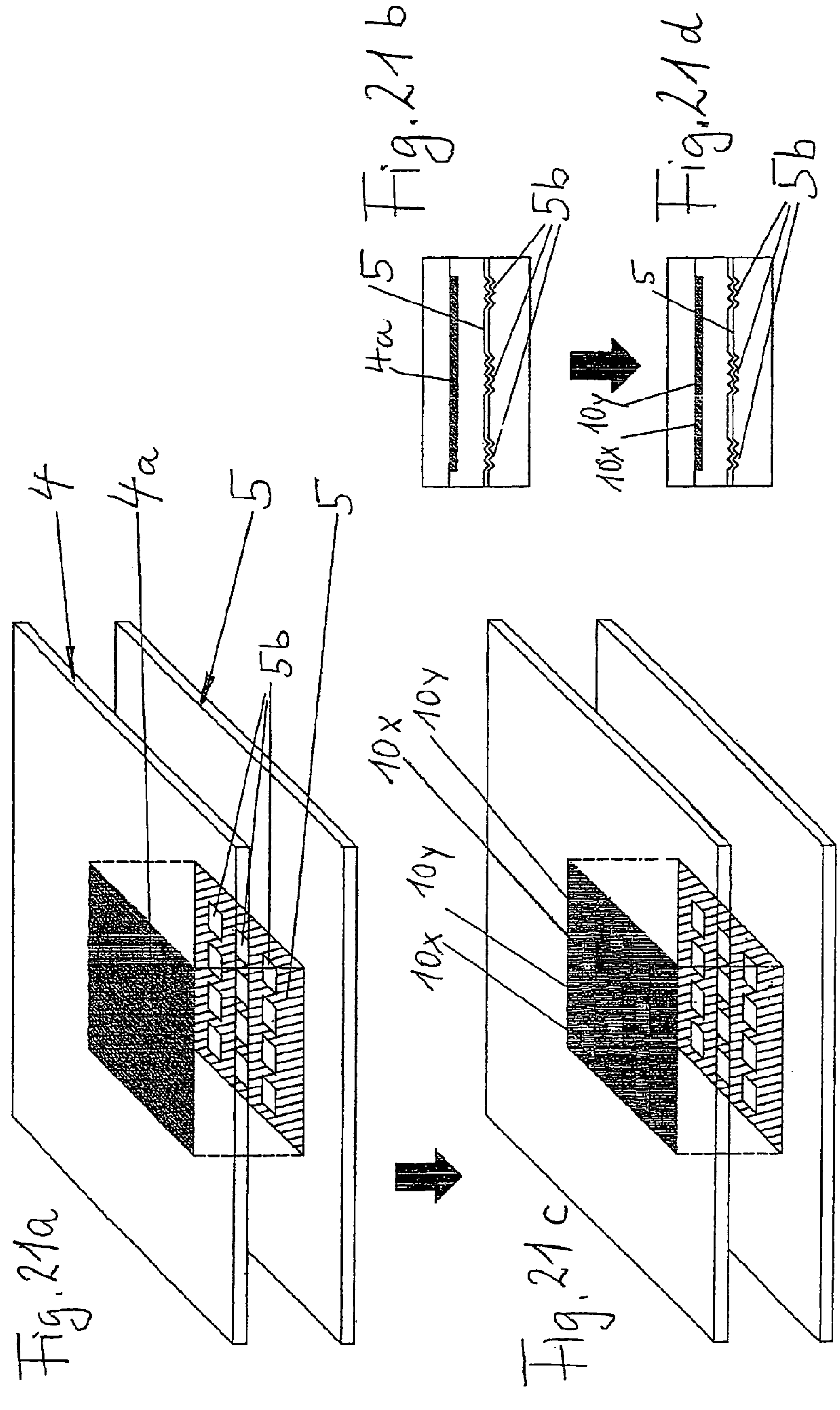

In the embodiment shown in FIG. 19, unlike the example in FIG. 18, the basic starting point adopted is a laser-sensitive layer which is of a color-shaded transparent nature, being for example green transparent. A script or text is produced in the laser-sensitive layer 4*a* by laser-induced color change. The script comprises a blue component and a yellow component.

The embodiment in FIGS. 20*a* through 20*d* is modified in relation to the embodiment in FIGS. 18*a* through 18*d* in that the laser-sensitive layer 4 is arranged at the side of the diffraction structure 5*b*, which is towards the substrate, and the diffraction structure covers over the laser-induced marking 10*x*, 10*y*. In other respects this embodiment in FIGS. 20*a* through 20*d* corresponds to the embodiment in FIGS. 18*a* through 18*d*.

In the embodiment illustrated in FIGS. 21*a* through d, the basic starting point adopted here is a film in which the laser-sensitive layer 4*a* is of a more or less covering green nature or of another color in the region 4*a*. In the region therebeneath, the background layer 5 has a reflection layer with individual regions, which are separated from each other, having a diffraction pattern 5*b*. Separate markings in the form of alternate, mutually spaced square areas 10*x* and 10*y* are produced by laser irradiation in accurate positional relationship in the laser-sensitive layer 4*a*. Suitable laser treatment with different conditions provides that the areas 10*x* are blue, preferably cyan, and the areas 10*y* are yellow. The region around the areas 10*x*, 10*y* is not laser-treated and remains of the original color, that is to say for example green. By virtue of positionally accurate guidance of the laser beam, it is possible for the areas 10*x*, 10*y* to be produced in accurate positional relationship, with respect to the diffractive areas. The areas 10*x*, 10*y* are more or less transparent so that, depending on light diffraction at the diffractive structures 5*b*, a play of colors or iridescence effect is produced, in dependence on the possibly superimposed colors and the wavelength-dependent reflection of the incident light. By virtue of the fact that the background layer 5 has alternate diffractive surfaces 5*b*—arranged in accurate register relationship with the laser-induced areas 10*x*, 10*y*—and regions which appear metallically mirroring, this configuration, in conjunction with the surfaces which are colored by the laser irradiation procedure, gives image impressions which vary in dependence on the illumination and viewing angles.

In a particular configuration of the embodiment shown in FIG. 21 it can be provided that the metal layer is in the form of a reflection layer only in separate individual regions 5*r* and the whole of the remaining region is in the form of a grating structure. The laser-sensitive layer can be irradiated by laser action in such a way that alternate areas 10*x*, 10*y* are bleached differently, that is to say different colors are produced. Those areas 10*x*, 10*y* forming the laser-induced color markings can be arranged in such a way that, viewed in a direction in perpendicular relationship to the plane of the layer, they are arranged in alignment over the reflection areas 5*r*. In that situation varying optical effects are produced depending on the respective illumination and viewing angles.

Figures 22A, 22B, 22C, 22D:
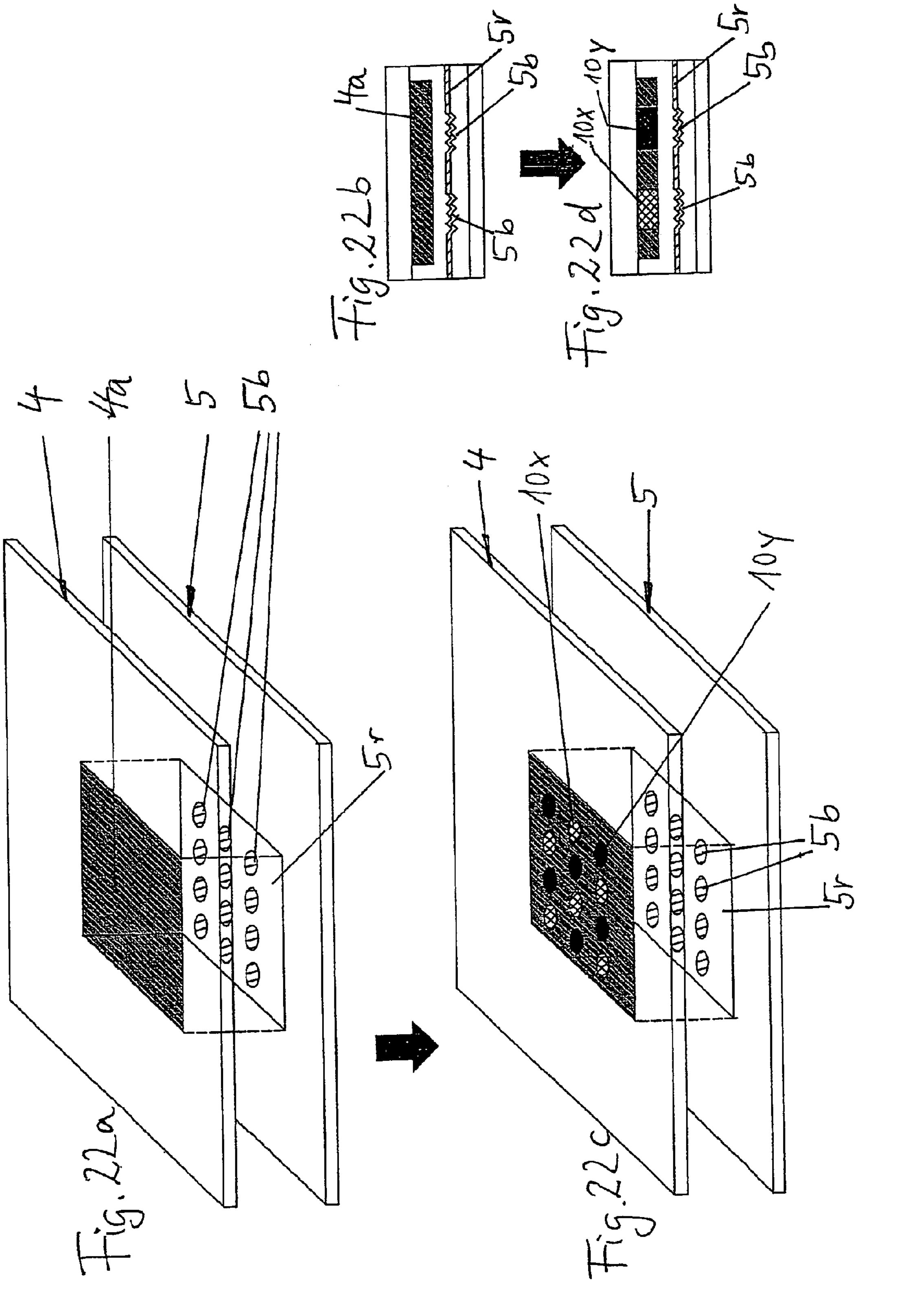
Figures 23A, 23B, 23C, 23D:
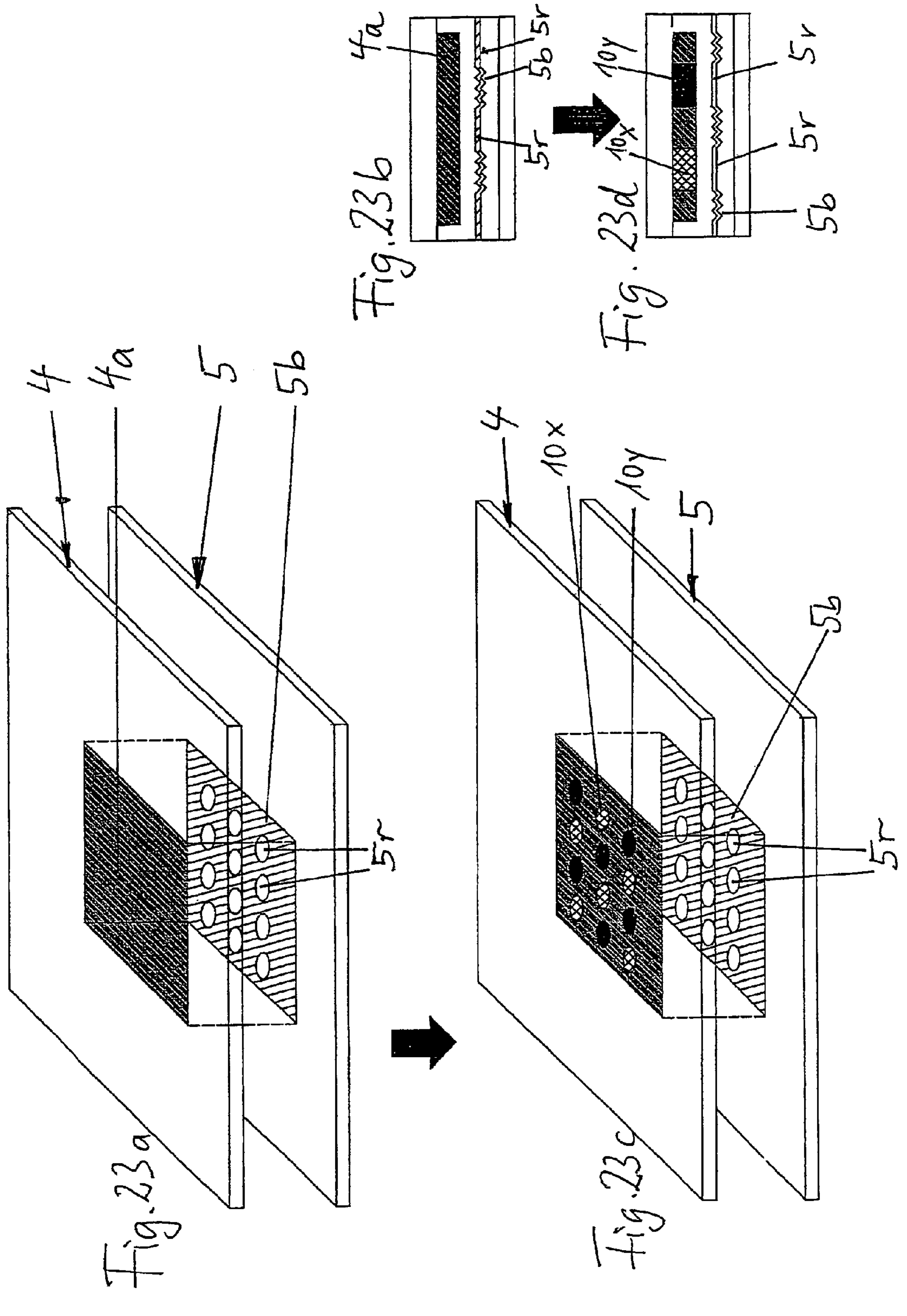
Figures 24A, 24B, 24C, 24D:
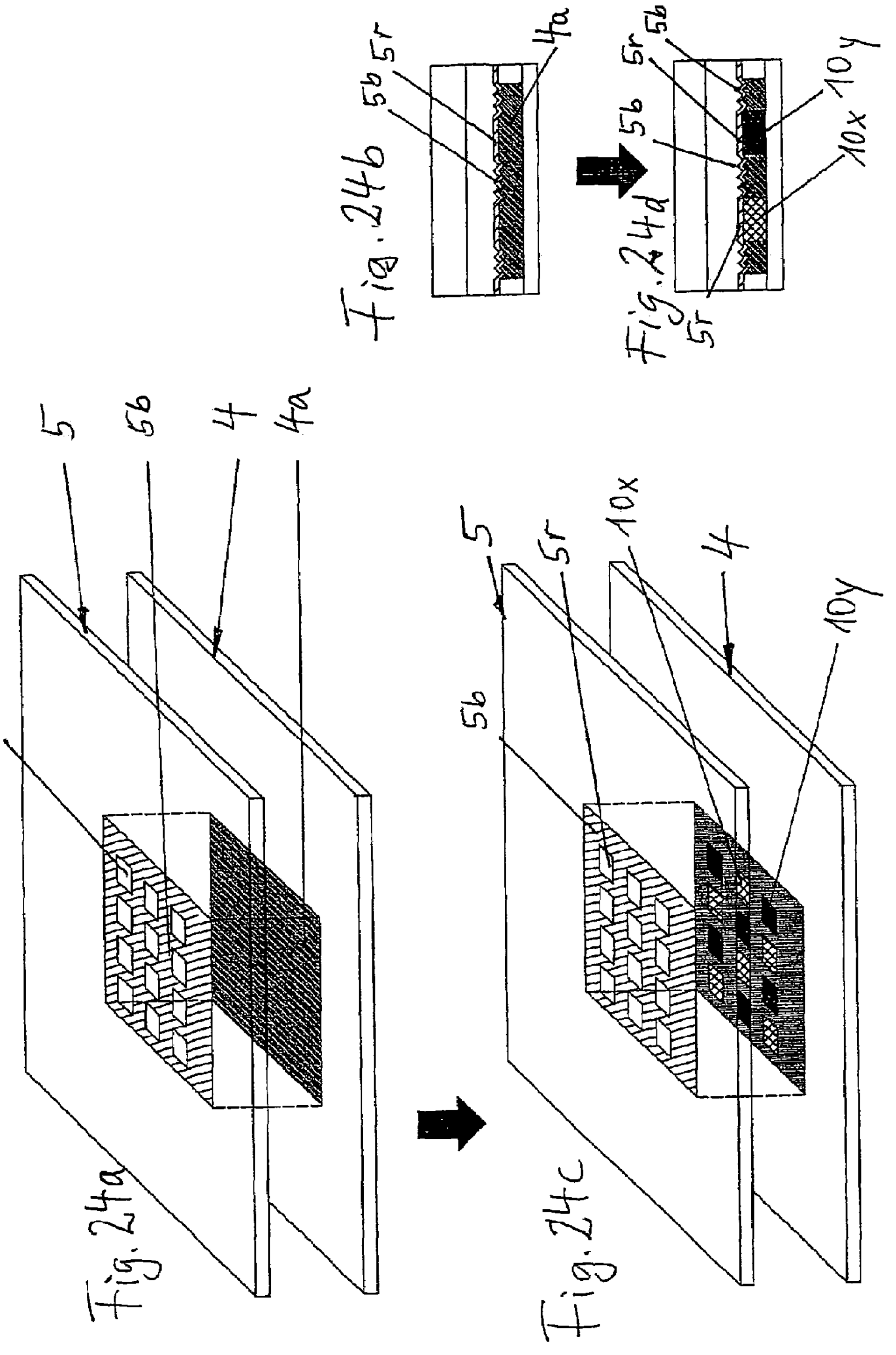
Figures 25A, 25B:
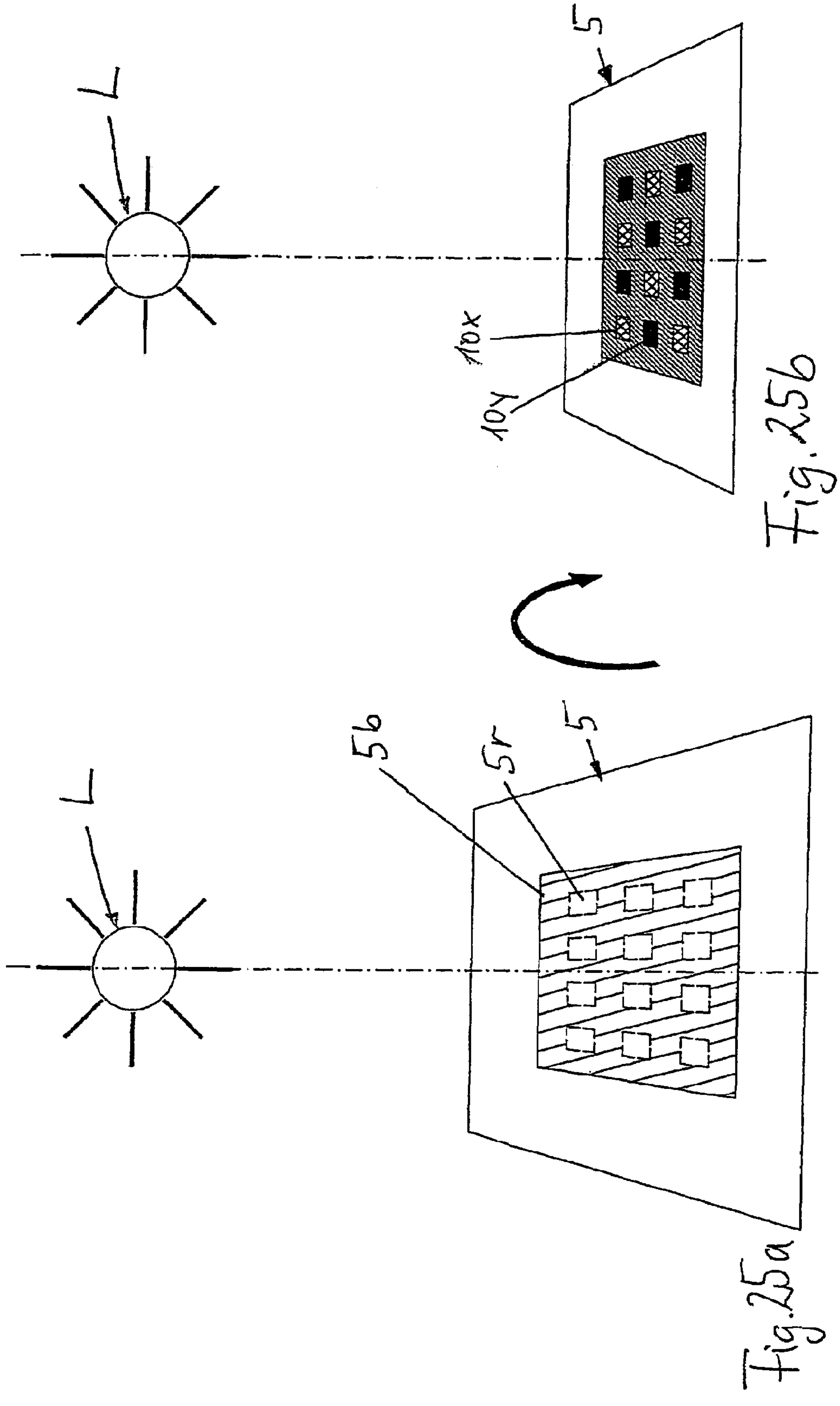

In a modified embodiment as shown in FIGS. 22*a* through 22*b*, round areas 10*x*, 10*y* are produced in an alternating sequence in differing colors in the laser-sensitive layer 4 by laser-sensitive bleaching. Viewed in a perpendicular direction with respect to the plane of the layer, they are arranged in accurate positional relationship in alignment over diffractive areas 5*b* which are also of a round contour in plan. The diffractive areas are provided in a reflection layer, which are arranged under the laser-sensitive layer 4, preferably immediately therebeneath. The embodiment in FIGS. 23*a* through 23*d* is modified in relation to the embodiment in FIGS. 22*a* through 22*d* insofar as round reflection areas 5*r* are arranged in the diffraction structure 5*b* and the laser-induced, also round color areas 10*x*, 10*y* are arranged in accurate positional relationship above the reflection areas 5*r*.

In the embodiment shown in FIGS. 24*a* through 24*g*, the basic starting point adopted is a film in which the partly transparent reflection layer 5 is arranged over the laser-sensitive layer 4. The laser-sensitive layer 4 is more or less covering, for example green or in another color in the region 4*a*. The reflection layer 5 has in region-wise manner a diffraction structure 5*b*, wherein in mutually separate individual areas 5*r* the reflection layer 5 is in the form of a flat layer without a diffraction structure. The reflection layer 5 is applied directly on the laser-sensitive layer 4 by vapor deposition. The diffraction structure 5*b* is provided in the reflection layer and the laser-sensitive layer 4 and extends into the laser-sensitive layer 4.

By virtue of laser irradiation through the reflection layer 5 exclusively in the region of the flat reflection areas 5*r* with the laser head being guided in accurate positional relationship, separate markings in the form of alternate mutually spaced square areas 10*x* and 10*y* are produced in accurate positional relationship in the laser-sensitive layer 4 which is disposed therebeneath. In this embodiment in FIG. 24, those laser-induced markings in the form of the square areas 10*x* and 10*y* are each disposed in precisely aligned and accurate register relationship in respect of their size and position under the flat reflection areas 5*r* of the reflection layer 5. Suitable laser treatment under differing conditions provides that the areas 10*x* and 10*y* are of differing colors, for example the areas 10*x* are cyan and the areas 10*y* are yellow.

The region around the areas 10*x*, 10*y* is not laser-treated and remains in the original color, that is to say for example green.

Figures 26A, 26B, 26C, 26D:
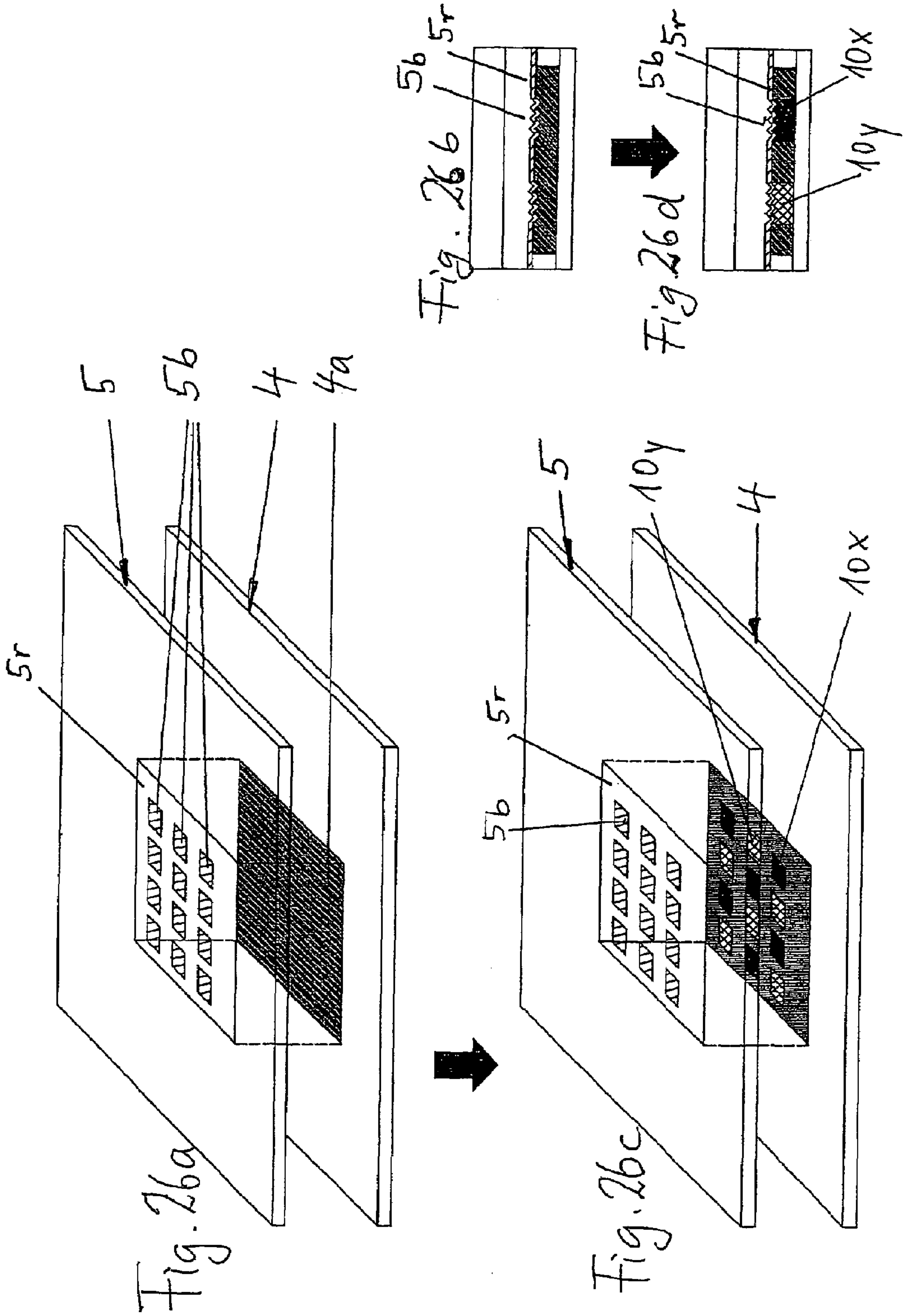

Light diffraction in the diffractive structure 5*b* in conjunction with the differing colors of the areas 10*x*, 10*y* gives rise to an iridescence effect which is dependent on the kind of illumination and the illumination and viewing angles. In that respect respective varying image impressions are produced. The diffraction image or the laser-induced color image becomes alternately visible, for example in a tilting movement of the film, whereby the illumination angle and/or the viewing angle is altered in dependence on the light source, as is diagrammatically shown in FIGS. 25*a* and 25*b*. In the position in FIG. 25*b* the surfaces 5*r* appeared colored and the diffraction structure is not effective. In the position in FIG. 25*a* in contrast the diffraction image is visible and is at least partially superimposed on the colored surfaces. The embodiment in FIGS. 26*a* through 26*b* is modified in relation to the embodiment of FIGS. 24*a* through 24*d* insofar as diffraction areas 5*b* are provided in the reflection layer 5*r* arranged over the laser-sensitive layer 4 and the laser-induced areas 10*x*, 10*y* are provided in accurate positional relationship under the diffraction areas 5*d*, wherein the mutually associated diffraction areas 5*b* and laser-induced areas 10*x*, 10*y* are each of the same rectangular base area.

Figure 27:
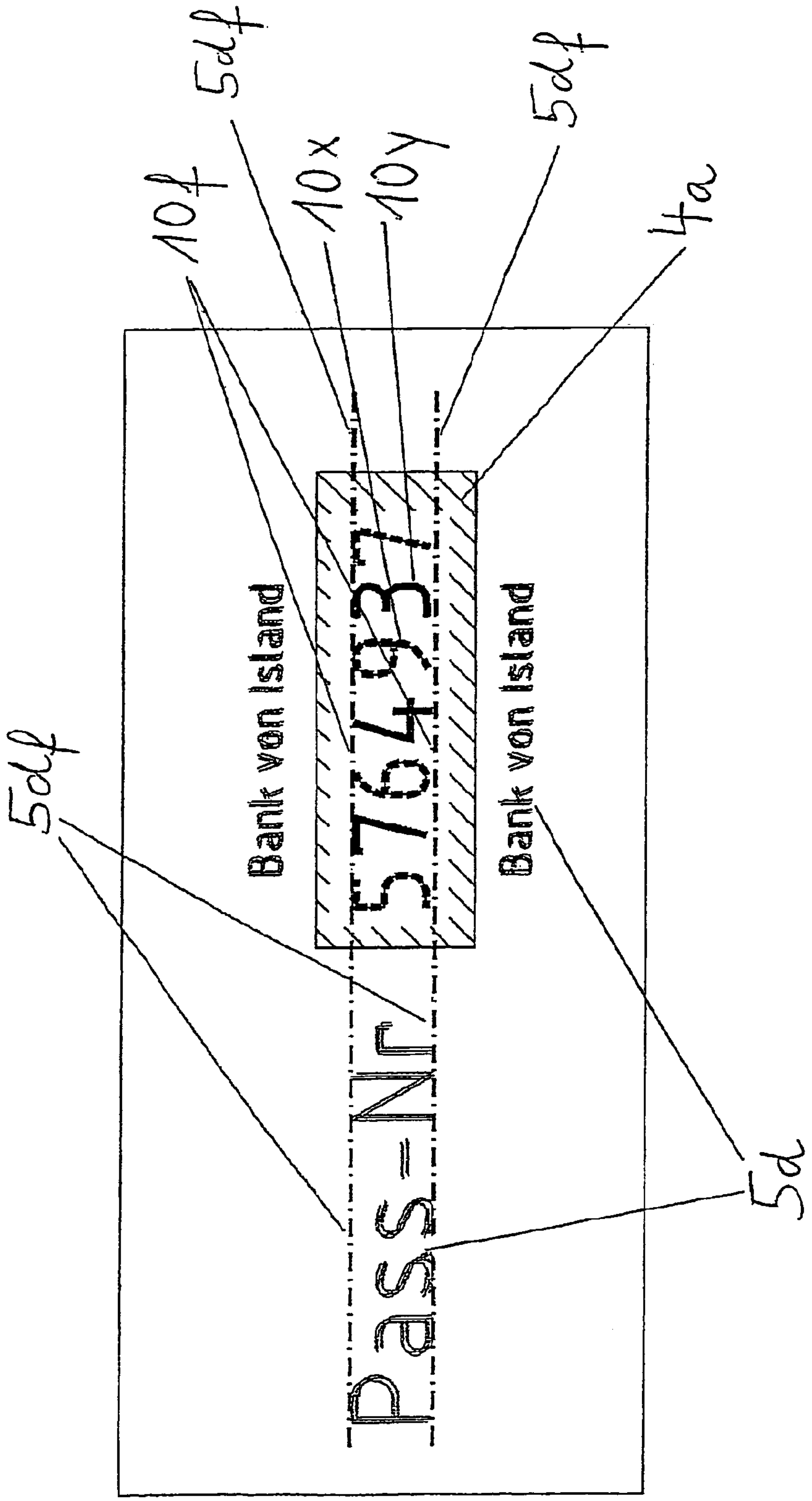
FIGS. 27 through 33 show plan views of further embodiments of a multi-layer image.

In the embodiment illustrated in FIG. 27 the laser-sensitive material in the layer 4 is arranged in a delimited region, a region which is rectangular in contour. The layer 4 is transparent outside the region 4*a* so that the printed image 5*d* provided in that region in the background layer is visible. The printed image 5*d* can be provided in a separate background layer of the multi-layer film or however also directly on the substrate surface. The printed image 5*d* is the word image 'Bank von Island' and the word image 'Pass-Nr.'. The latter is arranged in accurate register relationship between two parallel alignment lines 5*df* which are also printed on or which are only fictive, that is to say only notional.

By guiding the mass-less laser beam in accurate positional relationship, it is possible to continue the inscription with a degree of accuracy in the micrometer range in relation to the printed image 5*d* in the laser-sensitive region 4*a* by selective bleaching or selective color change. Therefore, a marking is produced, which the two alignment lines 5*df* of the printed image, which are arranged in both sides of the laser-sensitive area 4*a* or which also exist only fictively as notional alignment lines, continue in the area 4*a* in the form of laser-induced alignment lines 10*f*. Produced between the lines 10*f* in accurate register relationship is a corresponding laser-induced inscription 10*x*, 10*y*, in the illustrated embodiment the sequence of digits '5 7 6 4 9 3 7'. In that situation the individual digits 10*x*, 10*y* can be of differing colors and can each involve a color configuration or pattern, for example by virtue of a different color change or different bleaching in various regions of the digits or by virtue of a corresponding configuration in respect of the subjacent printed image which possibly appears therethrough. The individual digits 10*x*, 10*y* can also be of microscript nature. That achieves a high level of safeguard against forgery.

Figure 28:
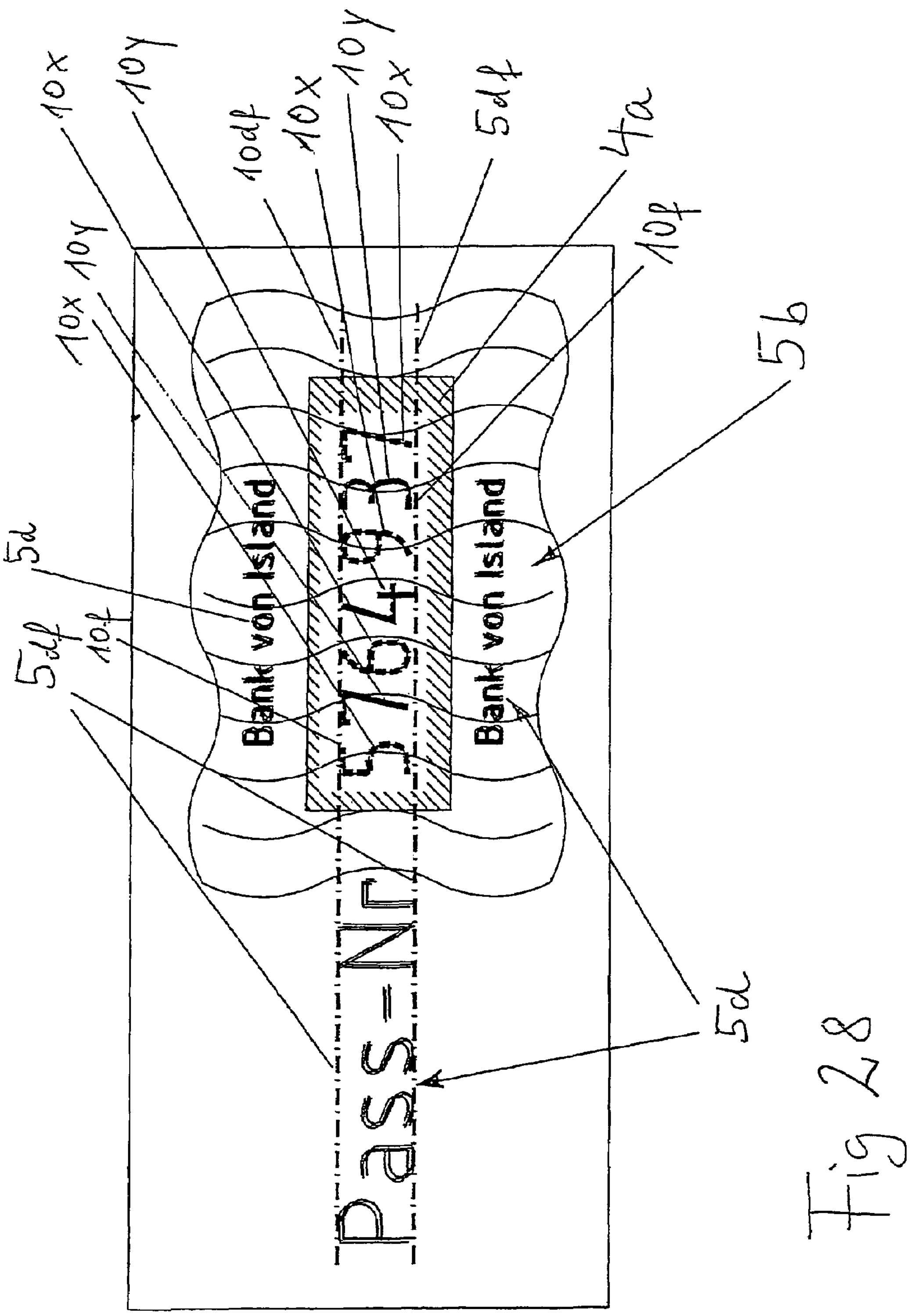

The embodiment shown in FIG. 28 involves a modification in relation to the embodiment of FIG. 27, wherein a diffraction structure 5*b* is arranged over the laser-sensitive layer 4*a* to enhance the anti-forgery safeguard. The diffraction structure can be produced resting directly on the laser-sensitive layer, for example in a reflection layer which in that delimited region is produced there by vapor deposition or in a reflection layer which covers over the whole of the surface of the embodiment, which is shown in FIG. 28. In the illustrated embodiment that reflection layer is in the form of a diffraction structure only in the region engaging over the laser-sensitive area 4*a*, the diffraction structure also being transparent. Laser treatment is effected by laser irradiation through the reflection layer or the diffraction structure 5*b*. In that case, in the same manner as in the embodiment in FIG. 27, the laser-induced markings are produced in accurate register relationship. An enhanced anti-forgery safeguard is affected by virtue of the fact that the diffraction structure is arranged over the laser-induced marking in the embodiment of FIG. 28 and the diffraction structure is joined directly to the layer in question, which has the markings.

Figures 29A, 29B:
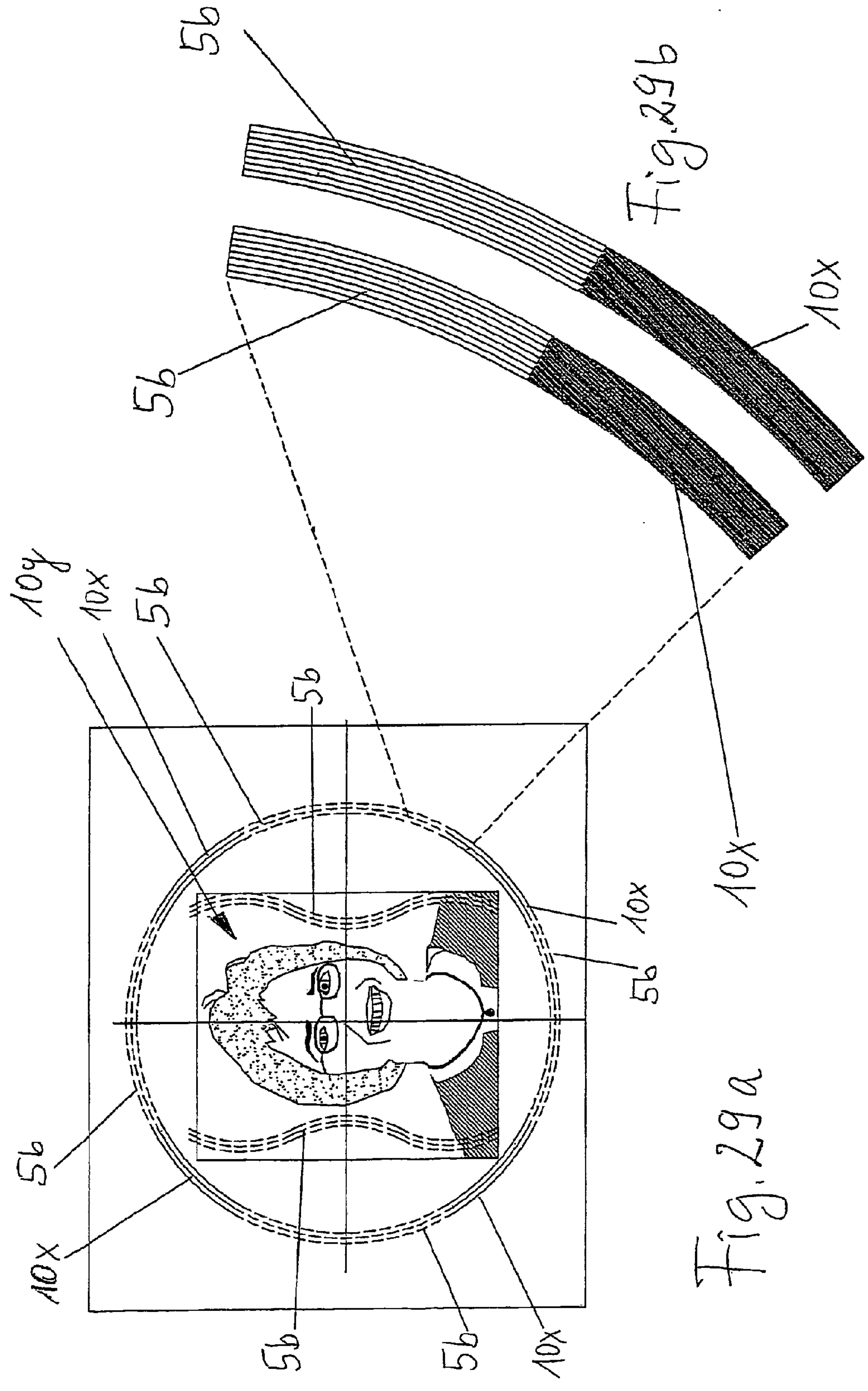

The embodiment in FIGS. 29*a* and 29*b* also involves an association of diffractive areas with laser-induced color surfaces, in accurate register relationship, wherein this embodiment, as the laser-induced image 10*y*, has a full-color portrait image produced by a laser-induced procedure. The laser-induced image is produced in a laser-sensitive layer 4. There are provided diffraction elements 5*b* which are in the form of guilloche patterns and which are supplemented in accurate register relationship by respective adjoining laser-induced colored guilloche patterns 10*x*. Such a structure comprising mutually adjoining arcuate regions which are alternately in the form of diffraction guilloche patterns 5*b* and laser-induced colored guilloche patterns 10*x* is arranged in the form of a closed circle around the laser-induced portrait image 10*y*. Diffraction guilloche patterns 5*b* which are in the form of sinuous lines are additionally provided in the edge regions of the laser-induced color image 10*y* and extend in portion-wise manner over the laser-induced image 10*y*.

The layer structure of the embodiment in FIGS. 29*a* and *b* is similar to the embodiment of FIG. 28. The diffraction structure elements 5*b* are arranged over the laser-sensitive layer in which the laser-induced image 10*y* and the laser-induced guilloche patterns 10*x* are arranged. The elements 5*b* are preferably arranged in a layer forming the reflection layer 5*r* in the remaining region, but they can also be provided exclusively and directly in the laser-sensitive layer 4*a*.

The laser treatment for producing the laser-induced full-color image 10*y* and the colored guilloche patterns 10*x* is effected in a corresponding manner as in the above-described embodiments.

Figure 30:
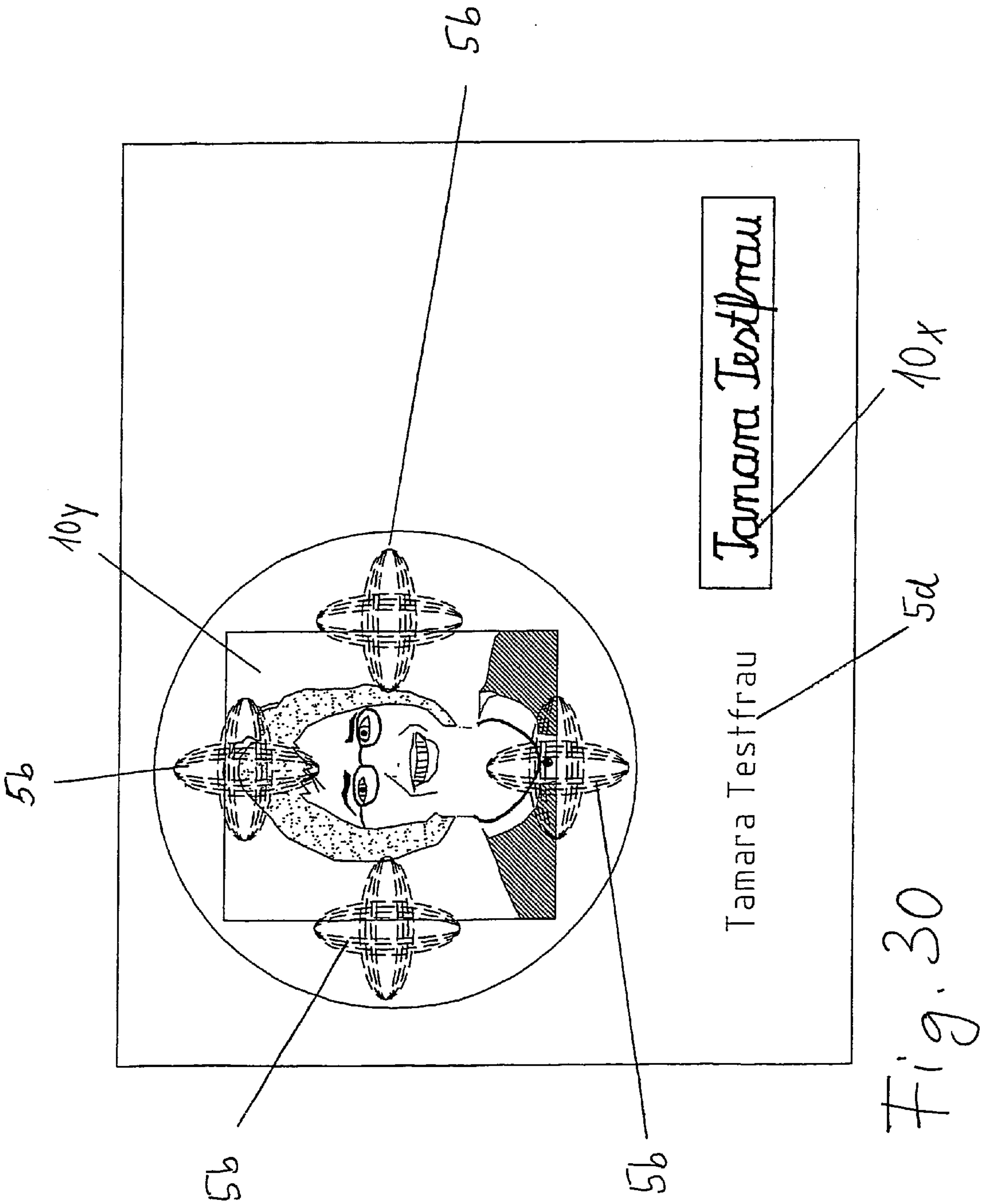

The embodiment illustrated in FIG. 30 involves an embodiment which is modified in relation to that shown in FIG. 29. It also has a laser-induced portrait image 10*y* which is in the form of a full-color image. Instead of the laser-induced and diffraction guilloche patterns however in the embodiment shown in FIG. 30 diffraction elements 5*b* which are of a star-shaped configuration in plan are arranged at the four edges of the laser-induced portrait image 10*y* in such a way that, with their one half, they engage over a respective edge region of the laser-induced color image 10*y* while, with another half, they engage over the region surrounding the laser-induced image 10*y*, thus in the manner of a conventional security stamp or seal. The layer structure of the embodiment in FIG. 30 can be of a corresponding configuration to that of the embodiment in FIGS. 29*a* and 29*b*. The layer structure can be formed by a film applied to the substrate, preferably a transfer film, in which case the laser-sensitive layer with the laser-induced portrait image 10*y* provided therein is arranged on the side that faces towards the substrate and the diffraction elements 5*b* are arranged at the side of the laser-sensitive layer that faces towards the substrate and thus engage over and obliterate the laser-induced image 10*y*. The embodiments in FIGS. 29 and 30 can involve personalised identity cards. In the embodiment in FIG. 30, the name 'Tamara Testfrau' is also applied in the form of a laser-induced marking, preferably of multicolor nature, as a signature under the laser-induced portrait image 10*y*. The script can be in microscript in order to enhance the anti-forgery safeguard aspect.

Figure 31A:
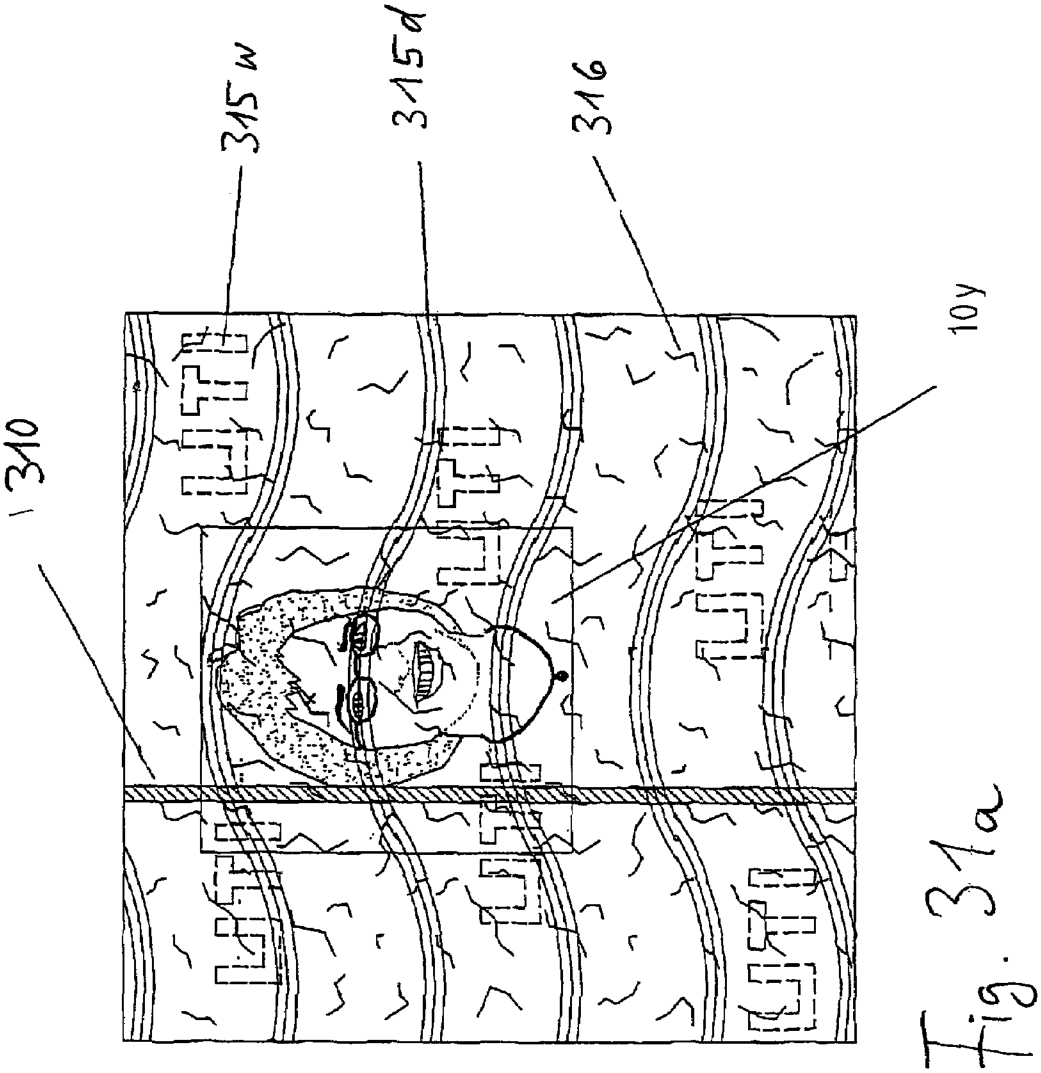
Figure 27B:
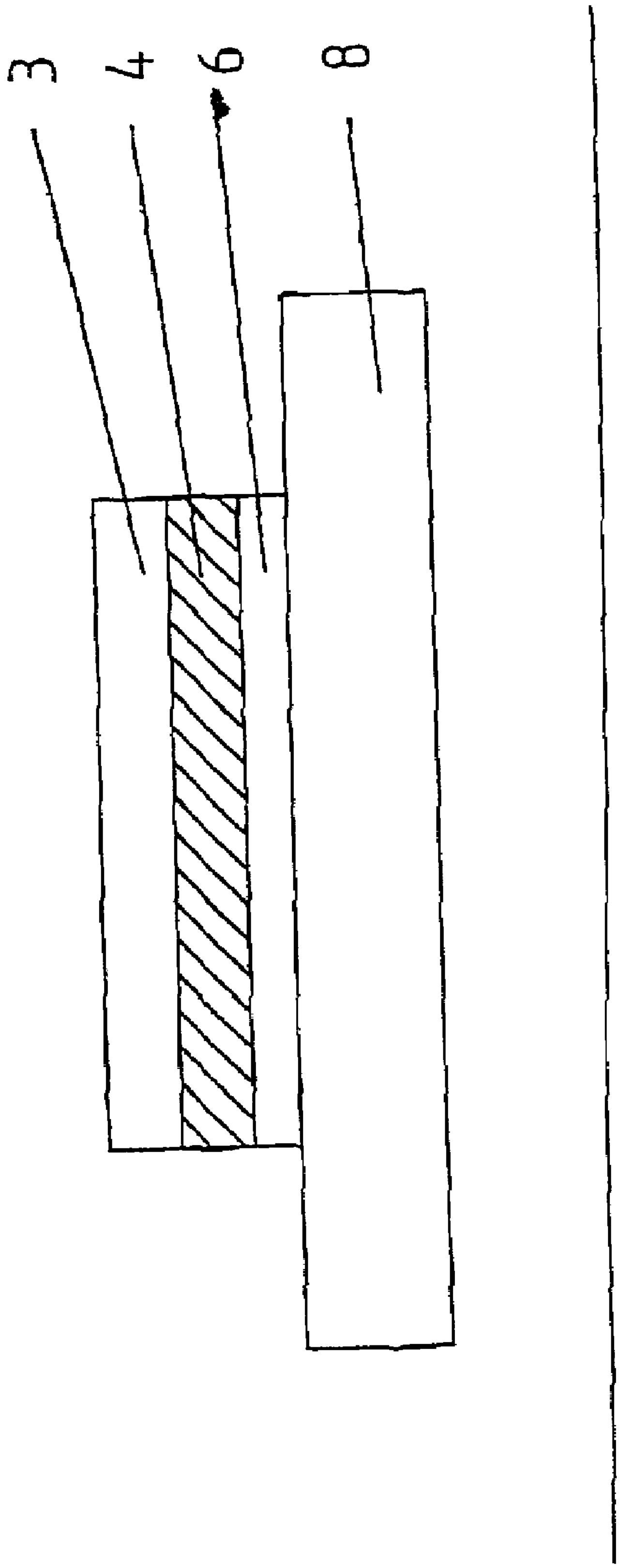

The embodiment of FIGS. 31*a* and 31*b* is an embodiment which is modified in relation to the embodiments of FIGS. 29 and 30. This embodiment comprises a carrier which forms the substrate and which is of paper material, on which there is applied a hot stamping film which, as can be seen from the sectional view in FIG. 31*b*, only comprises a laser-sensitive layer 4 and an upper protective layer 3 and has an adhesive layer 6 which represents the join to the substrate surface. A full-color image which is the same as in FIGS. 29 and 30 is provided in the laser-sensitive layer 4, as a laser-induced image. Unlike the preceding embodiments however no background layer 5 is provided in the layer structure of the hot stamping film. Rather, the background layer is provided on the surface of the substrate 8 in the form of a separate coating 315 or in the form of an integral constituent part of the substrate 8. This involves various identifications which each appear through the laser-induced image 10*y*, more specifically security printing 315*d* which for example can be guilloche patterns or the like and fluorescent threads 316 which for example can fluoresce under UV light and which are not visible under daylight or only appear as black threads. Watermarks 315*w* are also provided in the carrier 8 which preferably comprises paper material. Also arranged in the carrier 8 is a security strip 310 which passes through the laser-induced image 10*y* and also extends therebeyond in the region in which the laser-induced image component 10*y* is not provided. In the illustrated embodiment the laser-induced image 10*y* is rectangular in plan and is arranged only in a portion of the surface of the carrier 8. Preferably the carrier film having the laser-sensitive layer 4 is also provided only in that delimited region. As can be seen from FIG. 31*a*, the rectangular region of the laser-induced image 10*y* is transparent, that is to say the specified region of the laser-sensitive layer is bleached by way of the laser treatment in such a way that the colored image components are transparent in a colored shading and the region around the color markings is bleached in completely transparent fashion. That affords the advantage that the identification 315 on the substrate appears visibly through the laser-induced image 10*y*. That affords a particularly high level of anti-forgery safeguard.

Figure 32:
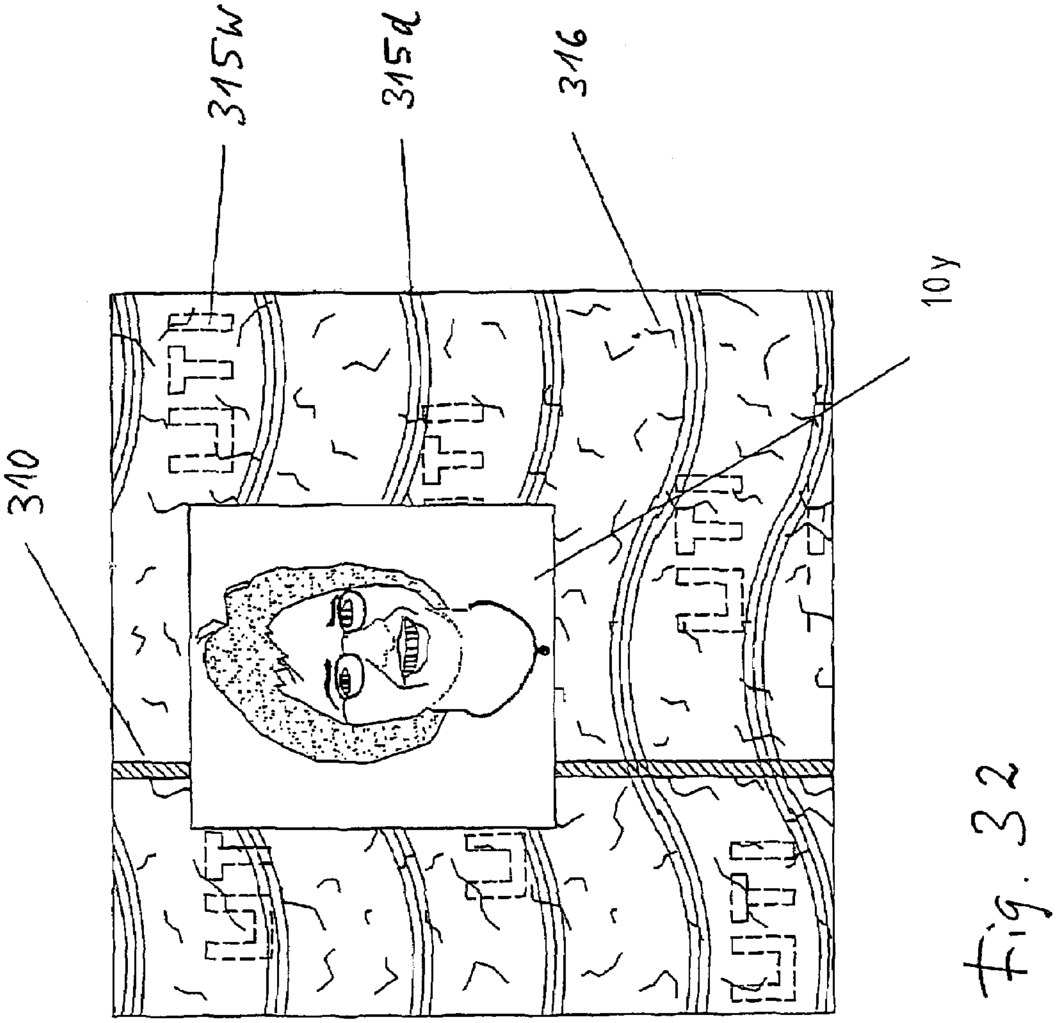

The embodiment shown in FIG. 32 is a modification in relation to the embodiment in FIGS. 31*a, b*. Unlike that embodiment, in FIG. 32 a background layer 5 is provided in the region of the laser-induced image 10*y*. That background layer 5 is a constituent part of the transfer film. Therefore, unlike the film shown in FIG. 31*b*, this embodiment in FIG. 32 uses a film which from the point of view of structure corresponds to the film shown in FIG. 1. The background layer 5 is provided on the side of the film that is towards the layer 8 and is thus arranged, when the film is applied to the substrate, between the laser-sensitive layer or the laser-induced image component, and the substrate surface. In this region the background layer 5 covers over the identification elements arranged on and in the substrate. The advantage of the background layer 5 is that the laser-induced image is very clearly discernible and, in the laser-induced image production procedure, no damage can occur to the substrate or layers disposed therebeneath. The background layer 5 is reflective for the laser radiation which acts in the image production procedure and is substantially opaque and absorbent for the non-reflected component of the laser radiation. In that way, in the laser irradiation operation for producing the laser-induced image 10*y*, damage or other undesired laser-induced changes to the substrate and the background are prevented. By virtue of the reflection of the background layer 5 and preferably by the addition of special brightening substances, the color action of the laser-induced image components is boosted and the color is preferably brightened up.

Figure 33:
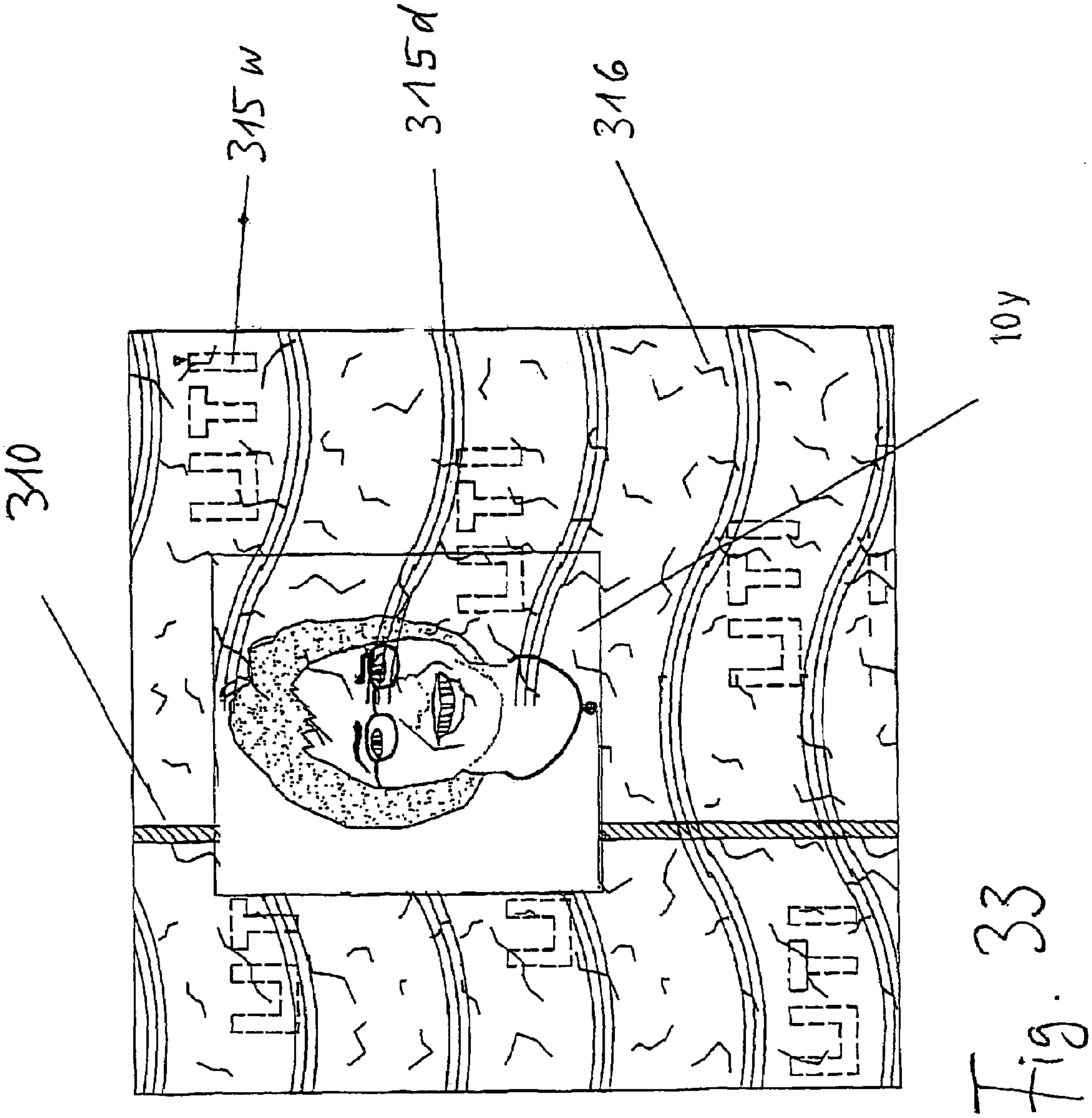

The embodiment illustrated in FIG. 33 is a modification of the embodiments in FIGS. 31 and 32. In this embodiment in FIG. 33, the background layer 5 is provided only in the left-hand half of the laser-induced color image 10*y* so that the identification 315 on the substrate 8 is covered over and is not visible only in that left-hand portion in which the background layer 5 is provided. No background layer 5 is arranged in the remaining region of the laser-induced image 10*y* so that, in that region, the surface of the substrate and thus the identification 315 are visible through the color-shaded, transparent, laser-induced color image. This embodiment affords a particularly elevated degree of anti-forgery safeguard as the laser-induced image 10*y* optically co-operates with the other identification elements in a particularly varied fashion.

In modified embodiments the laser-sensitive layer 4 can also be in the form of a layer which is only blackenable under laser light, for example in the form of a carbon- or carbon black-doped layer. It can be carbonised under the effect of laser radiation, in particular Nd: YAG laser radiation of the wavelength 1064 nm. This therefore permits a gray scale image if the laser condition, preferably the laser power, in the irradiation procedure, is suitably varied.

Figure 34:
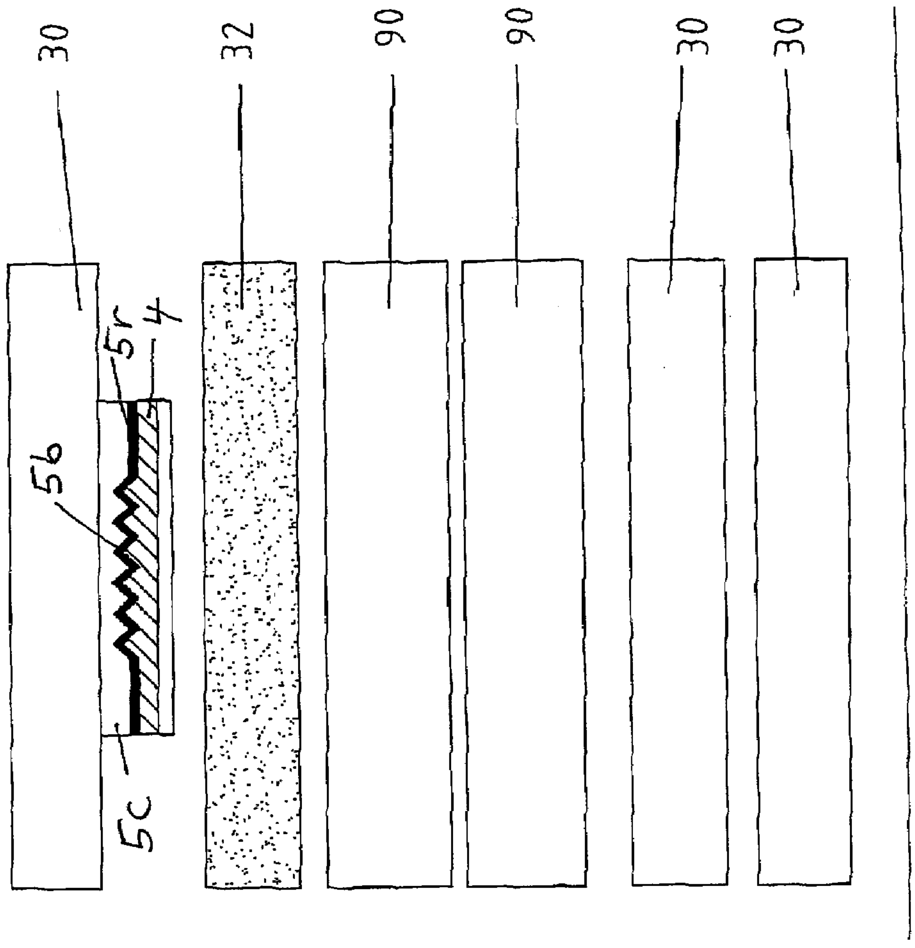
FIG. 34 shows an exploded view of a card laminated from overlay films and inlets with two laser-sensitive layers.

FIG. 34 shows an exploded view of a card structure. This involves a body which is laminated on various overlay films 30, 32 and inlets 90. The inlets 90 can preferably comprise paper material but also plastic material. Arranged on the upper inlet 90 is an overlay film 32 doped with carbon or carbon black and on which an overlay film 30 is applied. That overlay film 30 corresponds in structure to the laminating film, as is shown in FIG. 10. It has a carrier film 30, on the underside of which there is applied a transfer film, preferably a hot stamping film, which has an intermediate layer 5*c* and a reflection layer 5*r* and a laser-sensitive layer 4. A diffraction and/or hologram structure 5*b* is provided in the reflection layer 5*r* and in the laser-sensitive layer 4. In a modification (not shown) in relation to FIG. 33, an additional background layer 5 can be provided between the laser-sensitive layer 4 and the doped overlay film 32, as a separate overlay film or also as a lower further layer of the laminating film 30. In addition, such a background layer 5 can also be provided between the doped overlay film 32 and the inlet 90, as a separate overlay film or as a layer of the doped overlay film 32 or of the inlet 90. Those background layers 5 can be such that they reflect the laser radiation which in the laser-induced image production procedure acts in the layer disposed thereabove and/or they absorb the non-reflected component or at any event do not allow it through into the subjacent layer. It can also be provided that the background layer 5 is only arranged in the portion in which a laser-induced image component is produced in the laser-sensitive layer disposed thereover.

In the embodiment shown in FIG. 33 the laser-sensitive material in the laser-sensitive layer 4 can contain coloring agents which, in the manner described in relation to the above-described embodiments, produce bleaching or a color change under the action of the laser so that therefore the laser-induced image can be in the form of a color image, in that layer 4. A gray scale image can be produced as the laser-induced image in the overlay films 32 which are doped with carbon or carbon black, in a suitable laser treatment for example with Nd: YAG laser radiation of the wavelength 1064 nm.

The invention claimed is:

1. A multi-layer image, in particular a multi-color image, comprising and a single-layer or multi-layer structure applied to the substrate using a transfer film, or a laminating film, wherein the layer structure has a layer which has a laser-sensitive material,—said layer being referred to hereinafter as the laser-sensitive layer,—and which comprises at least one laser-induced image component in at least a region of the laser-sensitive layer which has been formed by the action of laser, wherein the multi-layer image or at least a portion of the multi-layer image further comprises a background layer and/or a foreground layer, the background layer being arranged on a side of the laser-sensitive layer facing the substrate, the foreground layer being colored and/or different in regard to an optical structure of the laser-induced image component or comprising, at least in region-wise manner, at least one of a printing, a reflection structure, a metal layer, a lacquer layer, a diffraction structure and/or a hologram structure, or the foreground layer comprising or forming an image component, wherein the laser-induced image component is arranged in at least partially overlapping relationship with the background layer or is arranged at least partially overlapped by the foreground layer, so that the background layer or the laser-induced image component respectively from above is visible only region-wise and/or is visible more or less translucently, wherein the laser-sensitive material is in the form of a mixture of various laser-sensitive components, wherein the mixture is composed of two or three different coloring agent components, wherein each of said two or three coloring agent components, in particular each coloring agent component of the mixture, is bleachable by means of laser under respective laser conditions which are specific for the coloring agent component and/or wherein the mixture is composed of two or three different color-forming components, in particular color-forming coloring agents, wherein each of said color-forming components and in particular each color-forming component of the mixture is color-variable by means of laser under respective laser conditions which are specific for the component.

2. A multi-layer image as set forth in claim 1, wherein the background layer forms the surface of the substrate.

3. A multi-layer image as set forth in claim 1, wherein the layer structure comprises a plurality of laser-sensitive layers, preferably comprising various laser-sensitive material, which are arranged in mutually superposed relationship.

4. A multi-layer image as set forth in claim 3, wherein a further background layer forming an intermediate layer is arranged between mutually superposed, laser-sensitive layers.

5. A multi-layer image as set forth in claim 1, wherein the background layer is arranged exclusively in the region under the laser-induced image component.

6. A multi-layer image as set forth in claim 1, wherein the background layer is in the form of a background layer which is reflective for laser radiation used for the production of a laser-induced image component and/or is non-transparent or substantially non-transparent and/or absorbent for the non-reflected component of the laser radiation.

7. A multi-layer image as set forth in claim 1, wherein the background layer is transparent for light in the visible spectral range and/or is transparent or non-transparent for laser radiation of only a given laser condition, in particular only a given wavelength range, and preferably is transparent or non-transparent for the laser radiation used for producing a laser-induced image component.

8. A multi-layer image as set forth in claim 1, wherein the laser-induced image component has different colors and/or the laser-induced image component and the background layer or foreground layer are colored and/or different in regard to the optical structure.

9. A multi-layer image as set forth in claim 1, wherein the laser-induced image component is in the form of a marking which is colorless transparent or color-shaded transparent or in the form of a marking which is black, preferably shaded in gray scales and transparent, or in the form of a marking which is non-transparent colored and/or black and/or with gray scales.

10. A multi-layer image as set forth in claim 1, wherein, arranged in adjacent relationship beside the laser-induced image component and preferably adjoining same in the same laser-sensitive layer, is a further laser-induced image component or a region of the laser-sensitive layer, which is not treated with laser, or a non-laser-sensitive region, wherein it is preferably provided that said adjacent region is colorlessly transparent or color-shaded transparent or non-transparent.

11. A multi-layer image as set forth in claim 1, wherein, provided in adjacent relationship beside the laser-induced image component and preferably adjoining same, is an image component which is formed in the background layer and/or in the foreground layer.

12. A multi-layer image as set forth in claim 1, wherein the laser-induced image component is arranged in accurate register relationship with the associated image component which is formed in the and/or by the background layer or the foreground layer.

13. A multi-layer image as set forth in claim 1, wherein the laser-induced image component is colorlessly or color-shaded transparent and an image component which is associated therewith and which is arranged in a layer disposed therebeneath or thereover, preferably in the background layer or the foreground layer, is arranged in laterally displaced or aligned relationship with respect thereto in a direction perpendicular to the plane of the layer.

14. A multi-layer image as set forth in claim 1, wherein the laser-induced image component, preferably in combination with another laser-induced image component and/or with an image component formed by the background layer and/or the foreground layer, is in the form of a colored marking and/or graphic and/or guilloche pattern and/or script image and/or microscript.

15. A multi-layer image as set forth in claim 1, wherein the laser-sensitive material is in the form of a material which can be changed by the action of the laser by way of laser-induced bleaching or laser-induced color change and/or laser-induced blackening and/or laser-induced material removal, preferably under material-specific laser conditions, and the laser-induced image component is formed by laser-induced bleaching or laser-induced color conversion or laser-induced carbonisation or laser-induced material removal respectively.

16. A multi-layer image as set forth in claim 1, wherein it applies with respect to each of the two or three components that under the laser conditions which are specific for a component the other components are not or are substantially not bleachable or not variable in color.

17. A multi-layer image as set forth in claim 1, wherein the laser-sensitive material is a cyan coloring agent, preferably cyan pigment, and/or a magenta coloring agent, preferably magenta pigment, and/or a yellow coloring agent, preferably yellow pigment.

18. A multi-layer image as set forth in claim 1, wherein, at a location of the laser-induced image component and/or at a location of the laser-sensitive layer, preferably at least in region-wise manner at each location of the laser-induced image component or the laser-sensitive layer respectively, the color is formed by a component or by a plurality of different components of the coloring agent mixture, preferably all various components of the coloring agent mixture, which are arranged at that location in a mixture, preferably in mutually superposed relationship and/or in mutually juxtaposed relationship, and in that respect the color at that location is formed by preferably subtractive color mixing.

19. A multi-layer image as set forth in claim 1, wherein the background layer and preferably the remaining other layers except the laser-sensitive layer are such that under the action of laser for forming the laser-induced image component the background layer is not changed.

20. A multi-layer image as set forth in claim 1, wherein the background layer and/or the foreground layer and/or the laser-sensitive layer has at least in region-wise manner a reflection structure and/or a metal layer and/or a lacquer layer which in particular is in the form of a bright layer, for example a white lacquer layer.

21. A multi-layer image as set forth in claim 1, wherein the background layer and/or the foreground layer and/or the laser-sensitive layer has at least in region-wise manner a diffraction and/or hologram structure, for example a diffraction grating, hologram or the like, in particular in or with a metallic layer.

22. A multi-layer image as set forth in claim 1, wherein the background layer and/or the foreground layer has printing at least in a region-wise manner.

23. A multi-layer image as set forth in claim 1, wherein the background layer preferably has identification elements fluorescing with UV light and/or a security thread and/or a watermark.

24. A multi-layer image as set forth in claim 1, wherein the background layer preferably has the reflection structure and/or the diffraction and/or hologram structure and/or the printing in different regions over the extent thereof, preferably in different colors and/or with a differing structure, or that the background layer is of a constant unitary configuration over the extent thereof.

25. A multi-layer image as set forth in claim 1, wherein the multi-layer image is in the form of a full-color image, which preferably has the colors from the whole color space.

26. A multi-layer image as set forth in claim 1, wherein the substrate comprises paper material.

27. A multi-layer image as set forth in claim 1, wherein the transfer film is a hot stamping film.

28. A multi-layer image as set forth in claim 1, wherein the coloring agent components are pigment components.

* * * * *

UNITED STATES PATENT AND TRADEMARK OFFICE

CERTIFICATE OF CORRECTION

PATENT NO. : 7,368,217 B2
APPLICATION NO. : 10/513615
DATED : May 6, 2008
INVENTOR(S) : Lutz et al.

It is certified that error appears in the above-identified patent and that said Letters Patent is hereby corrected as shown below:

On the title page item (57),
IN THE ABSTRACT:

| | |
|---|---|
| Line 3, | now reads “paper ubstrate”<br>should read --paper substrate-- |

Signed and Sealed this

Sixteenth Day of September, 2008

JON W. DUDAS
*Director of the United States Patent and Trademark Office*

UNITED STATES PATENT AND TRADEMARK OFFICE

CERTIFICATE OF CORRECTION

PATENT NO. : 7,368,217 B2
APPLICATION NO. : 10/513615
DATED : May 6, 2008
INVENTOR(S) : Lutz et al.

It is certified that error appears in the above-identified patent and that said Letters Patent is hereby corrected as shown below:

ON THE COVER PAGE:

| | |
|---|---|
| Assignee: | now reads "ORGA Systems GmbH"<br>should read --ORGA Systems GmbH and Leonhard Kurz GmbH & Co. KG-- |

Signed and Sealed this

Thirteenth Day of October, 2009

David J. Kappos

*Director of the United States Patent and Trademark Office*